(12) United States Patent
Mezghani et al.

(10) Patent No.: US 11,578,405 B2
(45) Date of Patent: Feb. 14, 2023

(54) APPARATUS FOR MONITORING CARBON NANOTUBE GROWTH

(71) Applicant: King Fahd University of Petroleum and Minerals, Dhahran (SA)

(72) Inventors: Khaled Mezghani, Dhahran (SA); Kahraman Demir, Dhahran (SA); Adnen Mezghani, Dhahran (SA); Ouail Balah, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 16/391,965

(22) Filed: Apr. 23, 2019

(65) Prior Publication Data

US 2020/0339422 A1     Oct. 29, 2020

(51) Int. Cl.
*C23C 16/44* (2006.01)
*C01B 32/164* (2017.01)
(Continued)

(52) U.S. Cl.
CPC .......... *C23C 16/4412* (2013.01); *B82Y 40/00* (2013.01); *C01B 32/164* (2017.08); *C23C 16/26* (2013.01); *C23C 16/4409* (2013.01); *C23C 16/455* (2013.01); *C23C 16/52* (2013.01); *B82Y 30/00* (2013.01); *C01B 2202/08* (2013.01); *C01B 2202/34* (2013.01); *C01P 2004/13* (2013.01)

(58) Field of Classification Search
CPC .................................................... B82Y 40/00
See application file for complete search history.

(56) References Cited

U.S. PATENT DOCUMENTS 4,020,273 A * 4/1977 Dix ........................... D01F 9/32
                                                         373/110
4,992,303 A * 2/1991 Whiffin .................. C30B 25/14
                                                         427/314
(Continued)

OTHER PUBLICATIONS

Koilraj, et al. ; Synthesis of Carbon Nanotubes Using Fe—Mo/Al2O3 Bimetallic Catalyst by CVD Method ; IEEE-International Conference on Advances in Engineering,Science and Management (ICAESM—2012) ; Mar. 30-31, 2012; 5 Pages.
(Continued)

*Primary Examiner* — Keath T Chen
(74) *Attorney, Agent, or Firm* — Oblon, McClelland, Maier & Neustadt, L.L.P.

(57) ABSTRACT

A carbon nanotube (CNT) growth apparatus includes: a body; an inlet cap; an outlet cap; insulation extending through a portion of an interior of the body, the insulation including a first stage and a second stage, a flow tube extending through the inlet cap and passing coaxially through the first stage of the insulation, the flow tube configured to receive and flow a fluid to the interior of the body; a gas heater including a plurality of heat pipes configured to be inserted in the first stage of the insulation, the plurality of heat pipes being disposed adjacent to the flow tube; a substrate heater incorporated in the second stage of the insulation; and a temperature controller configured to adjust a temperature of the gas heater and substrate heater, wherein a removed portion of the second stage is configured to provide an unobstructed view of the substrate.

12 Claims, 23 Drawing Sheets

(51) Int. Cl.
*C23C 16/26* (2006.01)
*C23C 16/455* (2006.01)
B82Y 40/00 (2011.01)
*C23C 16/52* (2006.01)
*B82Y 30/00* (2011.01)

(56) References Cited

U.S. PATENT DOCUMENTS

| | | | | |
|---|---|---|---|---|
| 5,480,300 | A * | 1/1996 | Okoshi | C30B 31/10 |
| | | | | 432/152 |
| 2006/0185595 | A1 | 8/2006 | Coll et al. | |
| 2006/0264045 | A1* | 11/2006 | Gu | C23C 16/4412 |
| | | | | 438/680 |
| 2007/0154382 | A1* | 7/2007 | Edwin | B01J 4/002 |
| | | | | 423/447.3 |
| 2007/0237694 | A1 | 10/2007 | Hsiao et al. | |
| 2008/0187648 | A1* | 8/2008 | Hart | B01J 23/745 |
| | | | | 427/8 |
| 2009/0217216 | A1 | 8/2009 | Lee et al. | |
| 2009/0232965 | A1* | 9/2009 | Hata | B82Y 30/00 |
| | | | | 427/8 |
| 2014/0087587 | A1* | 3/2014 | Lind | H01L 21/68792 |
| | | | | 439/527 |
| 2014/0311574 | A1* | 10/2014 | Gordon | C09B 23/005 |
| | | | | 136/261 |
| 2015/0183642 | A1 | 7/2015 | Lashmore et al. | |
| 2017/0342550 | A1* | 11/2017 | Siegal | C25D 11/04 |

OTHER PUBLICATIONS

SabreTube ; A Bench Top Thermal Processing System ; Absolute Nano ; Jan. 30, 2010 ; Product; 6 Pages.

* cited by examiner

FIG. 7A
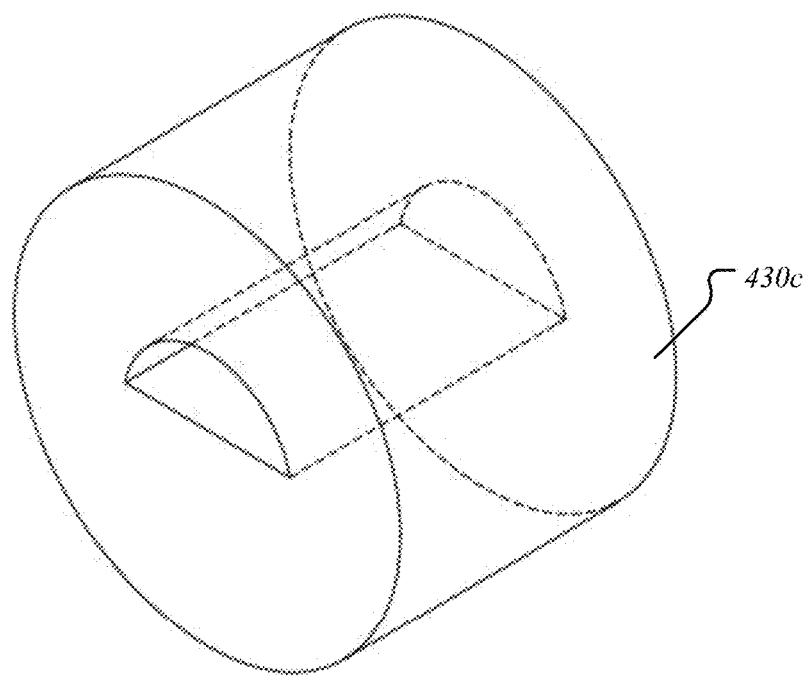
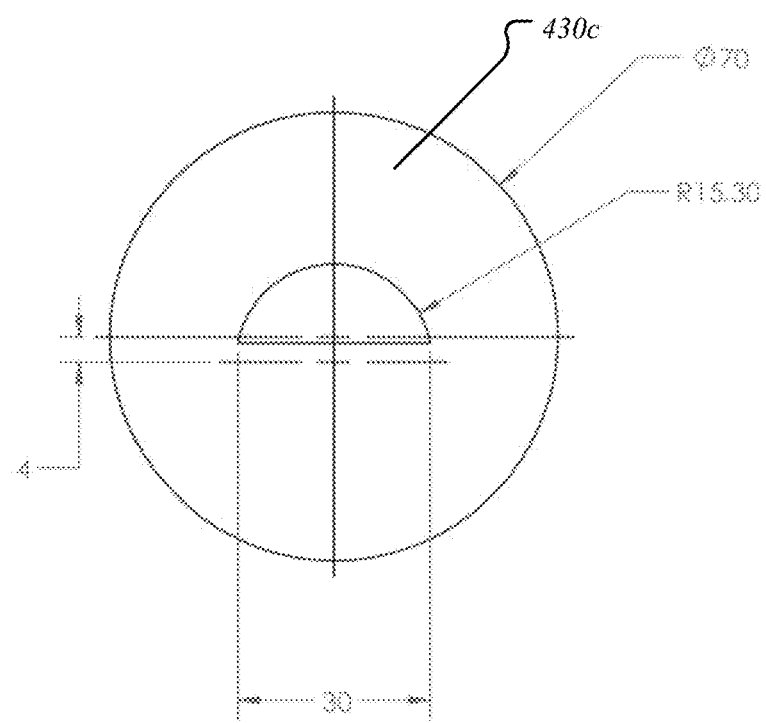
FIG. 7B

FIG. 8A
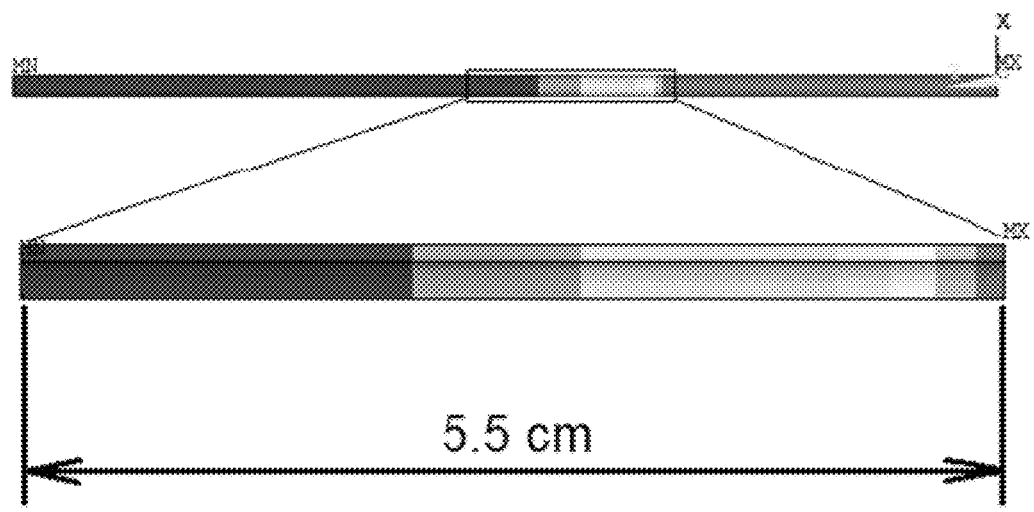
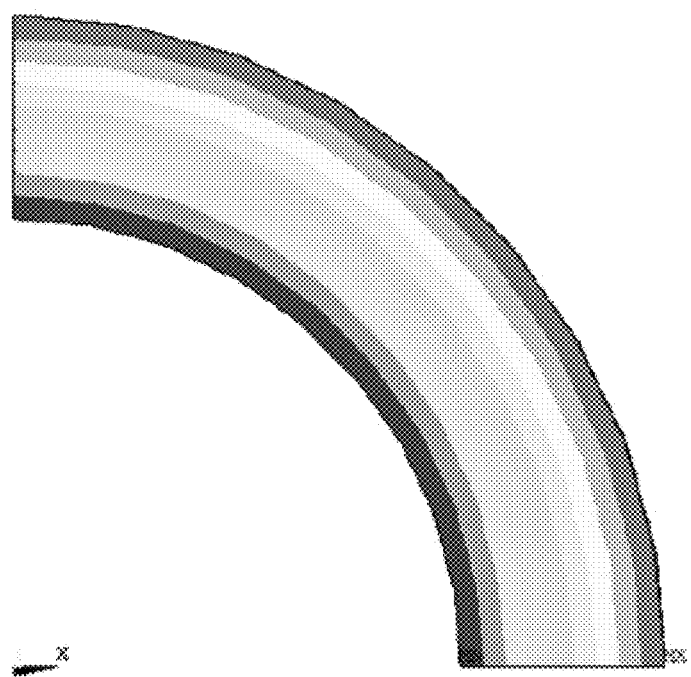
FIG. 8B

APPARATUS FOR MONITORING CARBON NANOTUBE GROWTH

STATEMENT REGARDING PRIOR DISCLOSURES BY THE INVENTORS

Aspects of this technology were described in "Design and Manufacturing of an Instrument for the Production of Aligned Carbon Nanotubes (CNT) via Chemical Vapor Deposition (CVD)" by Kahraman Demir, Adnen Mezghani, and Ouail Balah—May 31, 2018, which is incorporated herein by reference in its entirety.

BACKGROUND

Field of the Invention

The present disclosure is generally related to a growth furnace for growing carbon nanotubes (CNTs) and monitoring said growth.

Description of the Related Art

CNTs are allotropes of carbon with an elongated, cylindrical nanostructure. CNTs have hollow structure with walls made of graphene, a hexagonal structure made of carbon atoms. That is, a sheet of graphene may be rolled into a cylinder such that two edges of the sheet merge. FIG. 1 shows example patterns that may form based on the chiral vector along which the CNT is rolled to form the cylindrical structure, as described in (Jeehwan K., et. al. (2016). MIT Course 2.674 "Growing and Observing Micro and Nanostructures"). Controlling the chirality of the CNT is a key factor in determining the practical application of the CNT. CNTs can be single walled (SWCNT), double walled (DWCNT) and multi-walled (MWCNT), creating different properties according to their structure, as described in (Toyota H., Nagaoka K. (2016). Synthesis of Single-Wall Carbon Nanotubes by In-Liquid CVD. Key Engineering Materials. 1662-9795, Vol. 749, pp 217-222). CNTs have unique mechanical, electrical, optical, and thermal properties that make them especially applicable for use in a variety of industries including aviation, automotive, batteries, defense, water treatment, and more. Currently, the most popular use for carbon nanotubes is in structural reinforcement. The high strength and low weight of CNTs, combined with their flexibility, allow them to be mixed with other materials such that the overall mechanical performance of the mixture is improved. CNTs can be manufactured by methods that include pulsed laser deposition, arc discharge, and chemical vapor deposition (CVD), the most common of which is CVD.

CVD is parent to a family of processes whereby a solid material is deposited from a vapor by a chemical reaction occurring on or in the vicinity of a normally heated substrate surface. CVD is capable of producing high quality, high-performance, solid materials, at times under vacuum. The process is often used in the semiconductor industry to produce a thin film, powder, or single crystal. In CVD, the substrate is exposed to one or more volatile precursors, which react and/or decompose on the substrate surface to produce the desired deposit.

Frequently, volatile byproducts are also produced, which are removed by gas flow through the reaction chamber. CVD of hydrocarbons over a metal catalyst substrate is used to produce CNTs. A typical CNT forest is shown in FIG. 2A and FIG. 2B, as described by (Hart A., Laake L., Slocum A. (2007). Desktop Growth of Carbon-Nanotube Monoliths with In Situ Optical Imaging. Wily InterScience, 3, No. 5, 772-777). The reference also describes how growth of such CNTs may be limited by a decaying reaction rate of the catalyst.

FIG. 3A shows a schematic drawing of an example CNT synthesizer employing CVD, as described in Jeehwan K., et. al. Notably, the synthesizer includes a housing, flow gases, a heat source, a substrate holder, and flow tubes to deliver the flow gases to the housing and substrate holder. FIG. 3B shows an optical image of an example CNT synthesizer manufactured by Sinsil International where the entire sample stage in the quartz tube is encased by the heating device, thus preventing visual in-situ monitoring of CNT growth. FIG. 3C shows an optical image of an example CNT synthesizer manufactured by SabreTube where the heating device to preheat gas is a separate component/module and not disposed adjacent to the sample stage. This increases the distance the gas must travel after exiting the heating device and before reaching the substrate stage, thus increasing the heat loss that may occur. Moreover, the footprint of the SabreTube on the benchtop measures approximately 60 cm by 30 cm and its narrow tube reaction chamber houses a sample stage that is only capable of holding thin, elongated substrates that are at most 10 mm by 100 mm.

Although CNTs have great mechanical and electrical properties, their complex synthesis is a barrier to production scalability. Even growth of small-size samples of CNTs with predictable coverage, chirality, and density is difficult to achieve. Moreover, to grow said small-size samples of CNT, a commercial, sometimes large, instrument that includes an electric furnace housing a lengthy quartz tube may be utilized. However, in such instruments, the furnace may be wholly encapsulated in insulation, thereby hindering in-situ observation of CNT growth on the substrate. Furthermore, the size, footprint, and initial cost of said instrument may prevent its adoptability in smaller environments.

Therefore, an apparatus which allows for visual monitoring of CNT growth in a furnace having a compact form factor is desired. Accordingly it is one object of the present disclosure to provide a "desktop" CNT growth apparatus including a window for monitoring CNT growth, a system that includes the CNT growth apparatus, and a method of using the growth apparatus.

SUMMARY

The present disclosure relates to an apparatus for growth of CNTs including a window for monitoring CNT growth, a system that includes the CNT growth apparatus, and a method of using the growth apparatus.

In one embodiment of the invention, a CNT growth apparatus includes: a body; an inlet cap removeably attached to a first end of the body; an outlet cap removeably attached to a second end of the body; insulation extending through a portion of an interior of the body, the insulation including a first stage and a second stage, the first stage being substantially cylindrical and including a cylindrical flow tube passage and a plurality of cylindrical heat pipe passages oriented parallel to an axis of the first stage; a flow tube extending through the inlet cap and passing coaxially through the flow tube passage of the first stage of the insulation, the flow tube configured to receive and flow a fluid to the interior of the body; a gas heater including a plurality of heat pipes configured to be inserted in the plurality of heat pipe passages in the first stage of the insulation, the plurality of heat pipes being disposed adjacent to the flow tube passage, oriented circumferentially surrounding the flow tube passage, and aligned parallel to the axis of the first stage; a substrate heater incorporated in the second stage of the insulation; and a temperature controller configured to adjust a temperature of the gas heater and substrate heater, wherein a shape of the second stage is semicylinder such that a portion of the second stage is removed along a length axis of the second stage to form a flat surface of the second stage; the substrate heater is configured to be inserted into a recess formed in the flat surface of the second stage; the removed portion of the second stage is configured to provide an unobstructed view of the substrate; and a portion of the body surrounding the second stage is partially transparent and configured to allow visual monitoring of the substrate.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 7A shows a transparent view schematic of a third stage, according to an embodiment of the present disclosure;

FIG. 7B shows a schematic viewed down a length axis of a third stage, according to an embodiment of the present disclosure;

FIG. 8A shows a simulation of temperature distribution along a length of a flow tube, according to an embodiment of the present disclosure;

FIG. 8B shows a simulation of temperature distribution along a wall thickness of a flow tube, according to an embodiment of the present disclosure;

DETAILED DESCRIPTION

Figure 1:
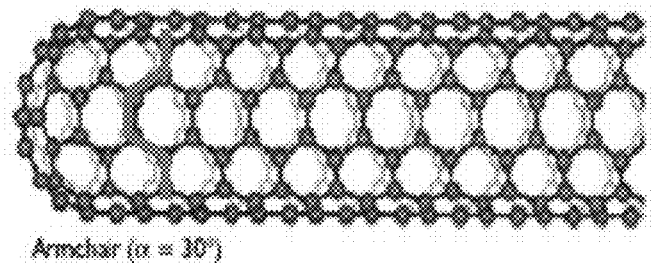
FIG. 1 shows example CNT configurations that may form based on the chiral vector along which the CNT is rolled to form the cylindrical structure.
Figure 1:
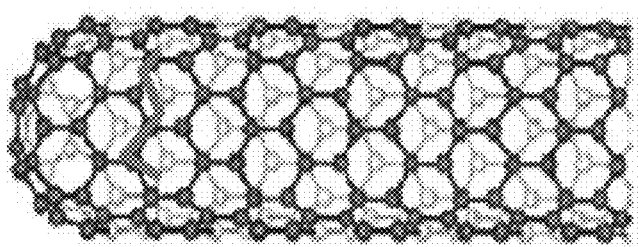
Figure 1:
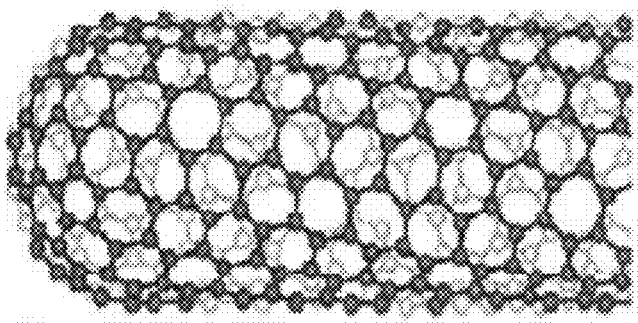
Figure 2A:
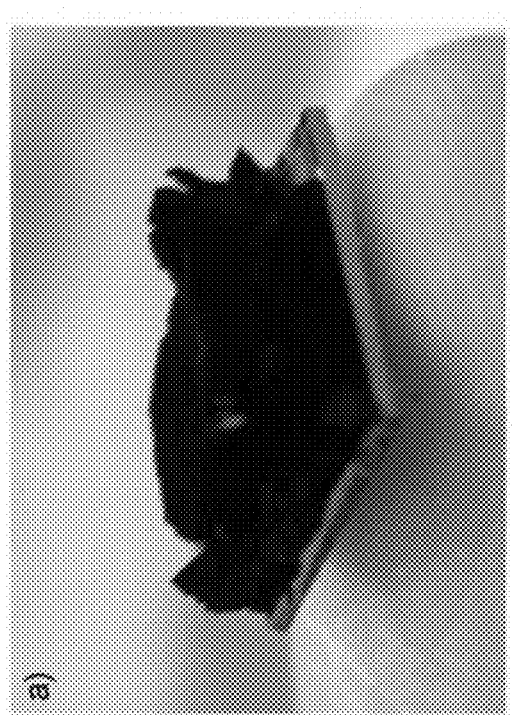
FIG. 2A shows a typical CNT forest on a substrate.
Figure 2B:
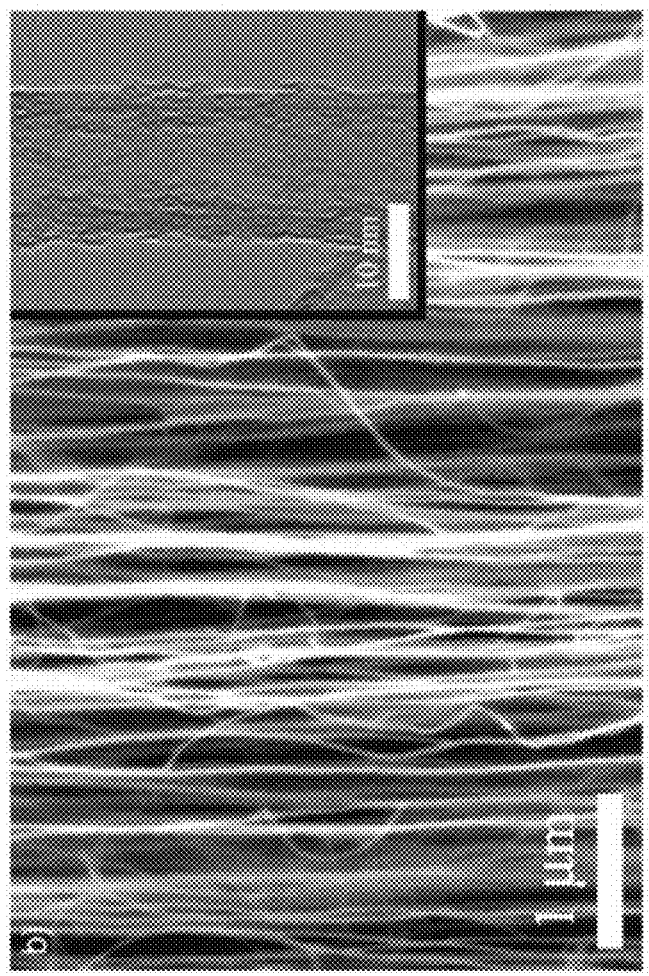
FIG. 2B shows a microscopy image of a typical CNT forest on a substrate.
Figure 3A:
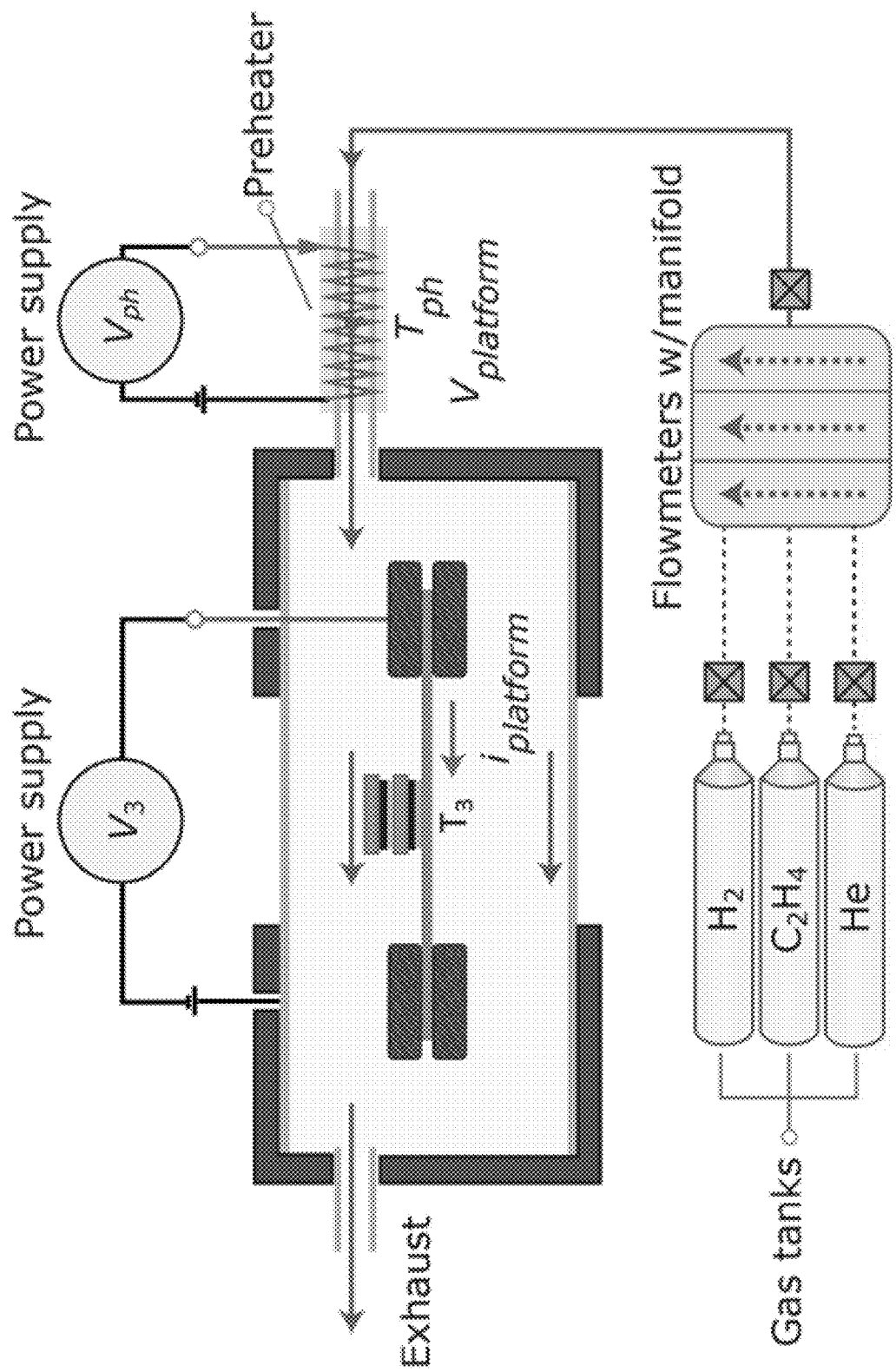
FIG. 3A shows a schematic drawing of an example CNT synthesizer employing CVD.
Figure 3B:
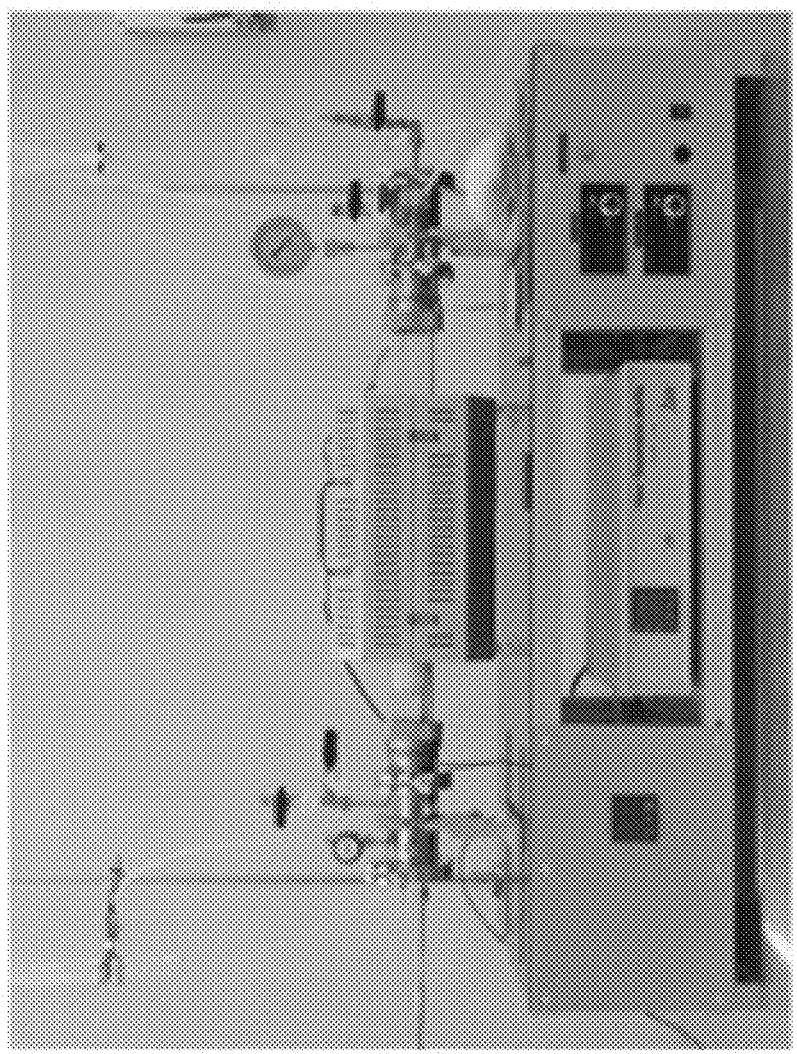
FIG. 3B shows an optical image of an example CNT synthesizer manufactured by Sinsil International.
Figure 3C:
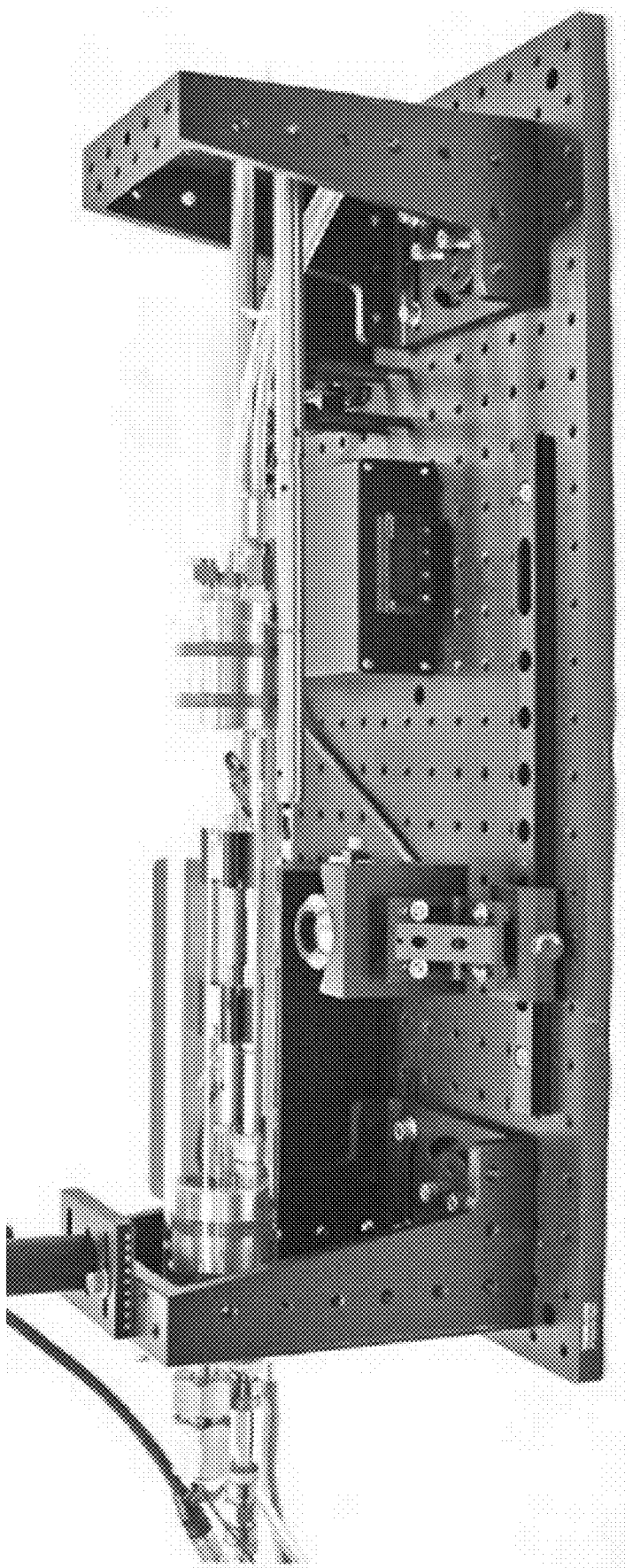
FIG. 3C shows an optical image of an example CNT synthesizer manufactured by SabreTube.

The foregoing "background" description is for the purpose of generally presenting the context of the disclosure. Work of the inventor, to the extent it is described in this background section, as well as aspects of the description which may not otherwise qualify as prior art at the time of filing, are neither expressly or impliedly admitted as prior art against the present invention. The foregoing paragraphs have been provided by way of general introduction, and are not intended to limit the scope of the following claims. The described embodiments, together with further advantages, will be best understood by reference to the following detailed description taken in conjunction with the accompanying drawings.

Referring now to the drawings, wherein like reference numerals designate identical or corresponding parts throughout several views, the following description relates to an apparatus for growing CNTs in a compact growth furnace.

As previously discussed, there are various different types of CNTs. The type and quality of CNT grown highly depends on the CVD reaction conditions and the composition of the precursor and catalyst. The precursor is commonly composed of a carrier gas (such as inert gases) and carbon source (e.g. methane, ethylene, cyclohexane, etc.). Another component in the mixture is an oxidizing agent such as water or air (e.g. oxygen).

The carbon source in the synthesis process may determine the type of CNT produced. For example, the CNT may be single-walled (SW), double-walled (DW), multi-walled (MW), vertically aligned, or curved. In brief, vertically aligned SWCNTs are grown using linear hydrocarbons (e.g. methane, ethylene, acetylene, etc.) while curved MWCNTs are produced using cyclic hydrocarbons (e.g. benzene, xylene, fullerene, cyclohexene, etc.) as described in (Abdullah, H. B., Ramli, I., & Ismail, I. (2017). Science & Technology. Hydrocarbon Sources for the Carbon Nanotubes Production by Chemical Vapour Deposition: A Review, 25, 379-396). The precursor may further include an oxidizing agent in order to remove amorphous carbon build up around the CNT growth zone, thereby resulting in higher purity.

The catalyst aids in the breakdown of the hydrocarbon by lowering its decomposition temperature to achieve surface decomposition by preventing aerial pyrolysis. It also acts as a nucleation site for the start of the CNT growth. However, their complete role in the process is still unknown, but many growth mechanism theories exist, as described in (K. A. Shah, B. A. Tali. (2016). Synthesis of Carbon Nanotubes by Catalytic Chemical Vapour Deposition: A Review on Carbon Sources, Catalysts and Substrates. Materials Science in Semiconductor Processing, 41, 67-82. https://doi.org/10.1016/j.mssp.2015.08.013), herein incorporated by reference in its entirety. Transition metals are the most widely used catalyst materials (e.g. Fe, Co, and Ni) due to carbon's high solubility and diffusion rates in these elements at high temperatures.

The substrate may also affect the synthesis of CNTs, wherein the substrate surface material and underlying layer composition affect the catalyst particle distribution on the substrate surface after heat treatment, as described by K. A. Shah and B. A. Tali.

The growth of CNTs may be classified in two main types: tip growth and root growth. Root growth occurs when the catalyst particle remains on the surface while the CNT grows. Tip growth occurs when the catalyst particle lifts from the substrate surface and allows for the growth to occur at the leading tip of the CNT as described by K. A. Shah and B. A. Tali. Of course, the temperature, pressure and flow rate of the precursor gas have an impact on the type, quality and quantity of CNT's grown. Obtaining optimal levels of each parameter can be challenging due to the interplay between each variable.

Figure 4A:
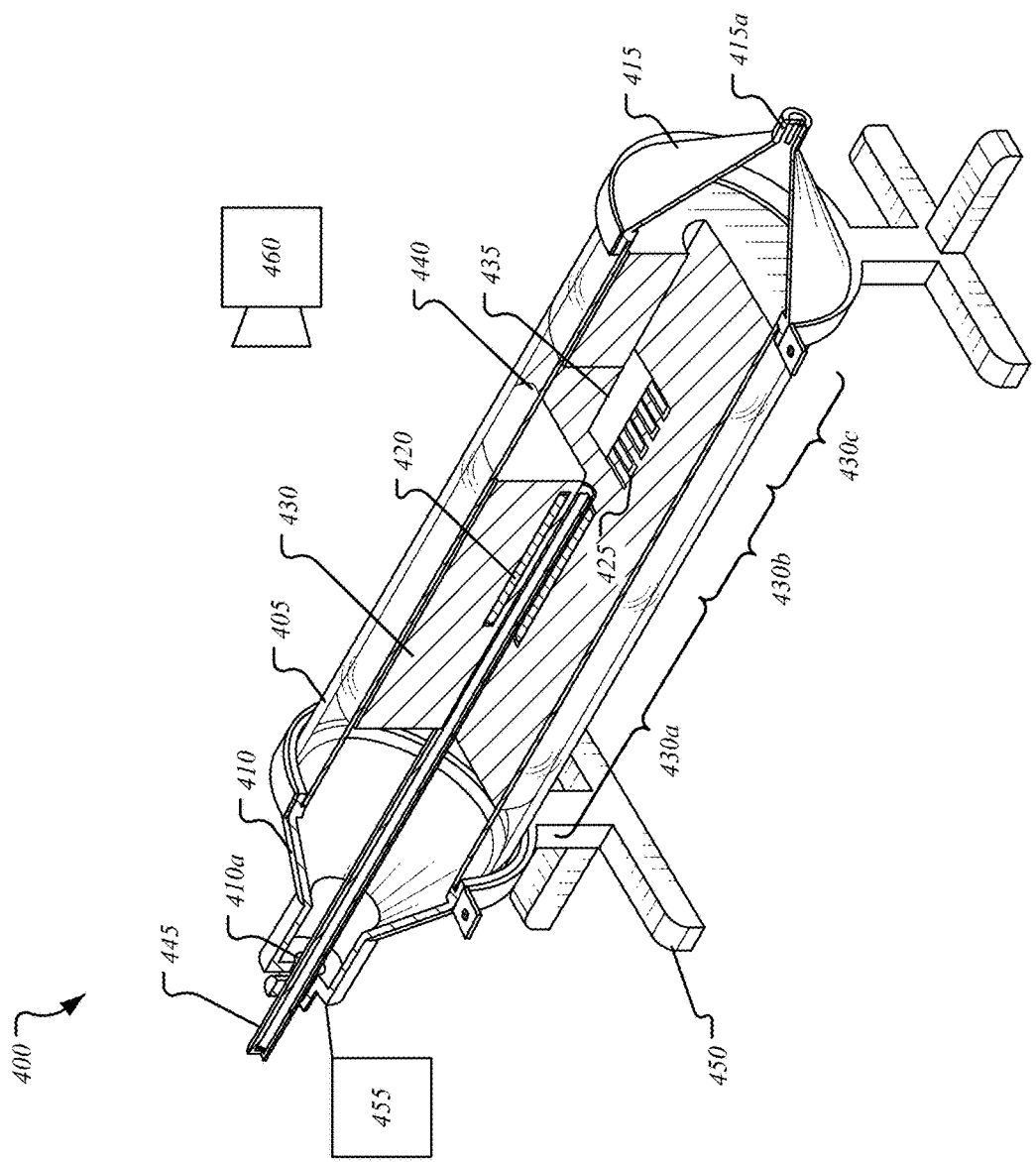
FIG. 4A shows a perspective view schematic of a CNT growth furnace apparatus, according to an embodiment of the present disclosure.
Figure 4B:
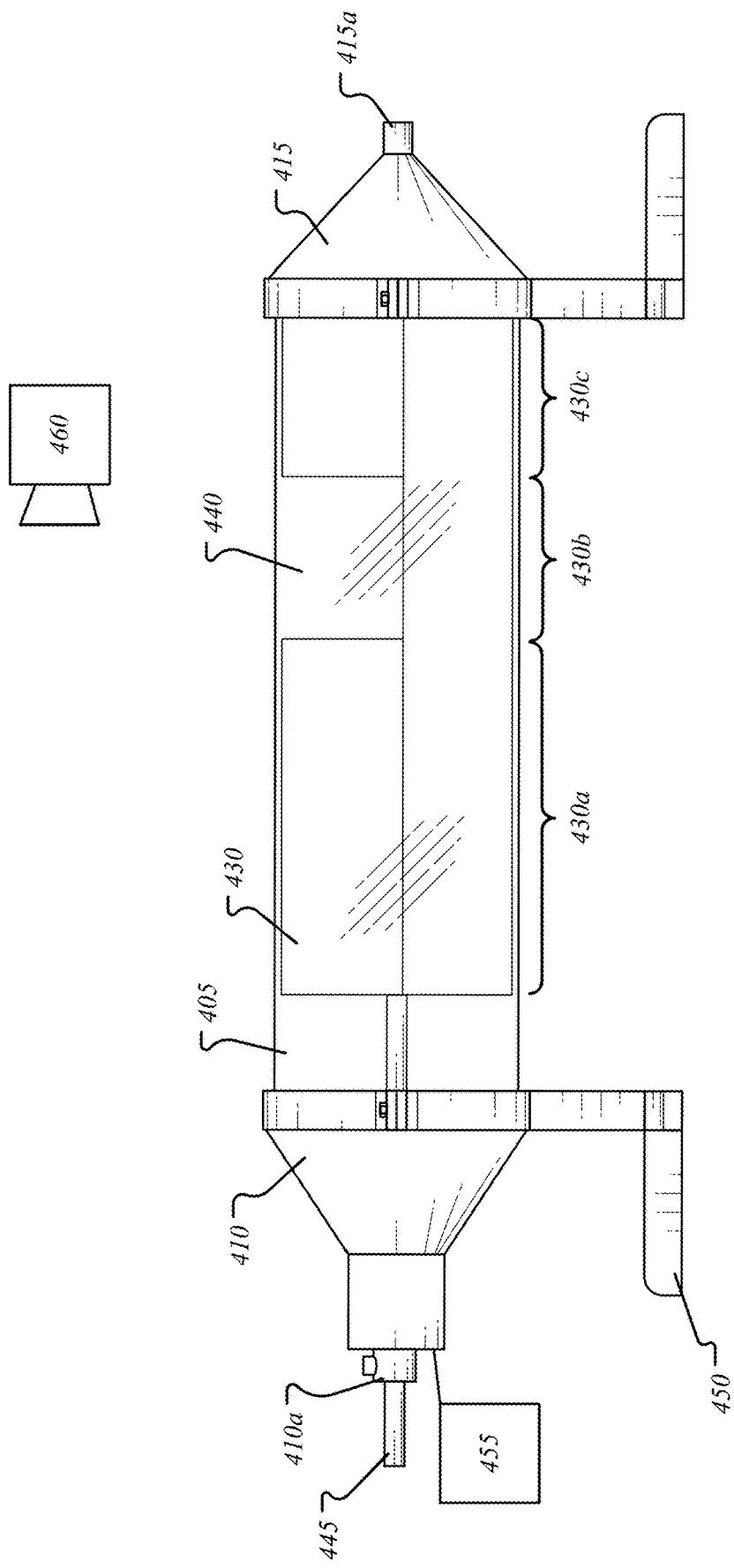
FIG. 4B shows a side view schematic of a furnace, according to an embodiment of the present disclosure.

FIG. 4A shows a perspective view schematic of a CNT growth furnace apparatus 400 (herein referred to as "furnace 400"), according to an embodiment of the present disclosure. FIG. 4B shows a side view schematic of the furnace 400, according to an embodiment of the present disclosure.

In an embodiment, the furnace includes a housing to hold components of the furnace 400 and prevent excessive heat and gas from escaping. The housing includes a body 405, an inlet cap 410, and an outlet cap 415. The inlet cap 410 is removeably attached to a first end of the body 405, and the outlet cap 415 is removeably attached to a second end of the body 405. The inlet cap 410 and outlet cap 415 may be secured to the body 405 by, for example, twist-tightening, push tightening, or clamped by a fastener, or any combination thereof. When attached, the inlet cap 410 and the outlet cap 415 may form a fluid seal with the body 405. The inlet cap 415 may include more than one inlet port 410a in order to allow other gas lines for gas purging or electronic circuitry access to the furnace 400. The body 405 may be in the shape of a hollow elongated tube, for example a cylindrical tube (as shown), a triangular tube, a rectangular tube, or a shape having any predetermined number of sides. Preferably, a cylindrical tube is used to maximize interior volume. The body 405 may be fabricated from a heat resistant material, for example a ceramic, a metal, or preferably, quartz. A combination of the aforementioned heat resistant materials may be used to form the body 405, wherein the quartz may form a transparent portion of the body.

The furnace 400 may further include a gas heater 420, a substrate heater 425, insulation 430, a substrate bed 435, a window 440, a flow tube 445, a stand 450, and an imaging system 460. In an embodiment, the inlet cap 410 may include an inlet port 410a configured to receive the flow tube 445 inserted therein. Upon receiving the flow tube 445, a fluid seal may form between the flow tube 445 and the inlet port 410a. The flow tube 445 may be configured to transport a fluid, for example a liquid or, preferably, a gas, from a fluid source (not shown) to an interior of the furnace 400. The gas flowed from the fluid source may include, for example, nitrogen, helium, argon, and oxygen. A precursor may be added to the gas, thereby making the gas a carrier, in order to transport the precursor inside the furnace 400 for a reaction. Herein, the fluid will be referred to as the gas, but it may be appreciated by those in the art that a liquid may be flowed through the flow tube 445 for a solution-state reaction.

The interior of the furnace 400 may house the insulation 430. The insulation may be formed to fit inside the shape of the body 405. In an embodiment, as shown in FIG. 4, the insulation is substantially cylindrical and includes a first stage 430a, a second stage 430b, and a third stage 430c. The insulation 430 may be fabricated from a thermally insulating material, for example silica. The first stage 430a and the third stage 430c may substantially fill the interior of the body 405, while the second stage 430b may include an open portion that forms the window 440. The first stage 430a may include a narrow hollow channel disposed along a center of a length axis of the first stage 430a to form a flow tube passage. The flow tube passage may be configured to receive the flow tube 445 inserted therein, wherein the flow tube 445 forms a fluid seal with the insulation 430 of the first stage 430a. The third stage 430c may include a wide hollow channel disposed along a center of a length axis of the third stage 430c. The wide hollow channel may be configured to allow the gas to flow from an end of the flow tube 445 terminating inside the furnace to the outlet port 415a. The outlet port 415a may include an exhaust tube (not shown) configured to carry the gas out of the furnace 400 and preventing back flow of gas into the interior of the furnace 400.

Figure 5A:
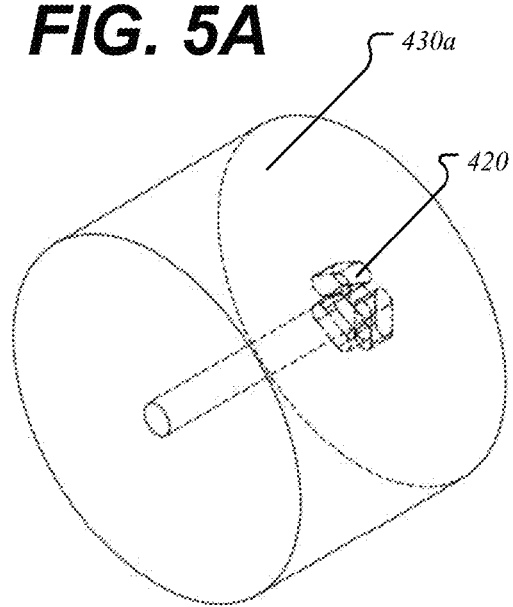
FIG. 5A shows a transparent view schematic of a first portion of a first stage, according to an embodiment of the present disclosure.
Figure 5B:
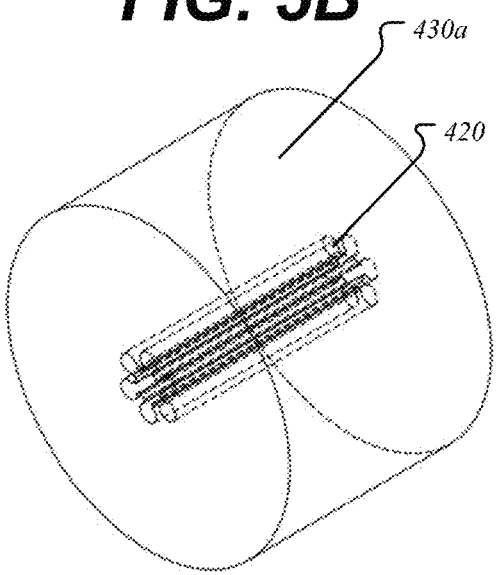
FIG. 5B shows a transparent view schematic of a second section of a first stage, according to an embodiment of the present disclosure.
Figure 5C:
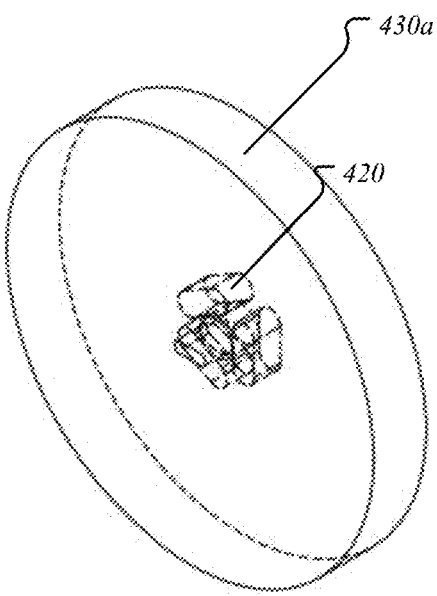
FIG. 5C shows a transparent view schematic of a third section of a first stage, according to an embodiment of the present disclosure.

FIG. 5A shows a transparent view schematic of a first portion of the first stage 430a, according to an embodiment of the present disclosure. FIG. 5B shows a transparent view schematic of a second section of the first stage 430a, according to an embodiment of the present disclosure. FIG. 5C shows a transparent view schematic of a third section of the first stage 430a, according to an embodiment of the present disclosure. In an embodiment, the first, second, and third sections may be combined to form the first stage 430a. The first stage 430a may be configured to heat the gas flowing in the flow tube 445 to a predetermined temperature. The first portion may be disposed closest to the inlet cap 410 of the three portions, the second portion may be disposed adjacent to the first portion on a side of the first portion opposite the inlet cap 410, and the third portion may be disposed adjacent to the second portion on a side of the second portion opposite the inlet cap 410. That is, the second portion is displaced between the first and third portions, and the first portion is closer to the inlet cap while the third portion is closer to the outlet cap 415. A diameter of the first, second, and third stages 430a-c may conform to the diameter of the body 405. For example, the diameter may be 60 mm to 80 mm, or 65 mm to 75 mm, or preferably, 70 mm.

Figure 5D:
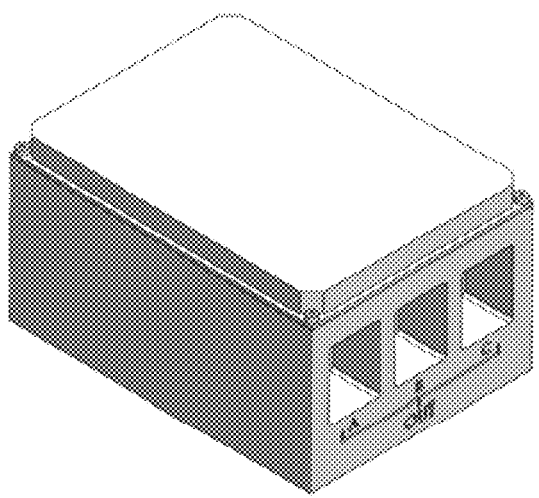
FIG. 5D shows a perspective view schematic of a proportional-integral-derivative (PID) controller, according to an embodiment of the present disclosure.

FIG. 5D shows a perspective view schematic of a proportional-integral-derivative (PID) controller 455, according to an embodiment of the present disclosure. The predetermined temperature may be determined by the growth recipe and controlled via the PID controller 455. It may be appreciated by those in the art that the PID controller 455 may be another device that is not limited to PIDs, such as a temperature controller, a computer, a cloud-based server allowing remote monitoring, etc. The PID controller 455 may be configured to control temperatures of more than one heater simultaneously, for example three heaters. The PID controller 455 may include a program for the user to interact with the PID controller 455. The PID controller 455 may include common electronic components that facilitate its construction by those less skilled in the art. For example, the components may include an Arduino MEGA 2560 microcontroller board, quad-channel relay board, and more than one MAX31856 thermocouple amplifier boards. The program for the PID controller 455 may be written in C# for the Windows application and in C++ for the Arduino firmware. The program for the Arduino firmware for the PID controller 455 may include PID calculations, heater control, and serial communication code. The program for the Windows application for the PID controller 455 may be configured to control the CNT growth recipe, set sequential heating and cooling sequences, set temperature set points and heating rates, set PID controller 455 parameters and, display and log CNT growth runtime data.

Figure 5E:
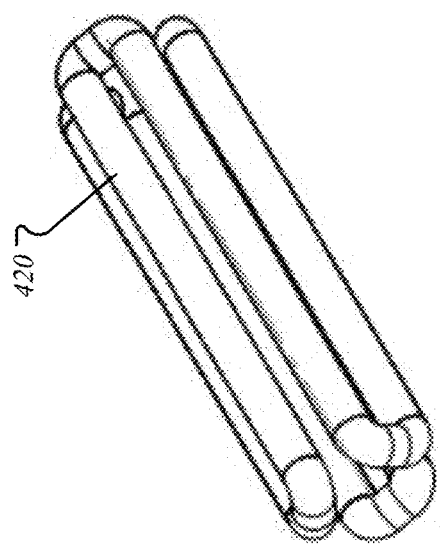
FIG. 5E shows a perspective view schematic of a gas heater, according to an embodiment of the present disclosure.

FIG. 5E shows a perspective view schematic of the gas heater 420, according to an embodiment of the present disclosure. In an embodiment, the gas heater 420 includes a plurality of, for example six, straight portions that form heat pipes which may be fabricated from, for example, aluminum, titanium, tungsten, copper, or preferably, steel. The heat pipes may be arranged in a circular, circumferential orientation such that lengths of each heat pipe are substantially parallel. Each heat pipe may be connected to the adjacent heat pipe by a curved portion, wherein the location of the curved portions alternate between ends of each heat pipe to form a serpentine structure surrounding a hollow volume (as shown). For example, the hollow volume of the gas heater 420 may be the flow tube passage configured to receive the flow tube 445. It may be appreciated that any number of heat pipes and corresponding curved portions to connect the heat pipes may be used in order to surround the flow tube 445 and effectively heat the gas.

In an embodiment, the heating may be accomplished via the gas heater 420, which may be disposed adjacent to the flow tube 445 as described above. In an embodiment, the gas heater 420 may be integrated into the insulation 430 of the first stage 430a. As opposed to having a separate or external heating source to heat the gas, the gas heater 420 may be disposed in the furnace 400 and thus reduce the overall footprint of the furnace 400. As shown in FIG. 5A, the first portion includes the flow tube passage for the flow tube 445 extending through the entire first portion (and extends through the second and third portions as well). The first end of the first portion may be disposed closer to the inlet cap 410. A second end of the first portion includes volumes of the insulation 430 removed or recessed into the first portion to fit the curved portions of the gas heater 420 (i.e. three of the six curved portions). The locations of the curved removed volumes may align with the locations of the curved portions when installed on the straight portions. As shown in FIG. 5B, for the gas heater 420 with six heat pipes, a corresponding number of heat pipe passages may be removed from the second portion. For example, the heat pipes may be substantially cylindrical, and thus six cylindrical heat pipe passages may be removed from the second portion. The heat pipe passages may be arranged adjacent to and circumferentially surrounding the flow tube passage wherein the lengths of the cylindrical volumes are substantially parallel to the axis of the cylindrical shape of the second portion. The six heat pipes of the gas heater 420 may be configured to be inserted into the corresponding six cylindrical heat pipe passages of the second portion. Three of the curved portions of the gas heater 420 may be installed onto the ends of the six heat pipes of the gas heater 420 and the second end of the first portion may be installed onto the first end of the second portion such that the three curved portions are inserted into the corresponding curved removed volumes in the first portion of the first stage 430a. Similarly, a first end of the third portion of the first stage 430a includes three curved removed volumes to fit the other three curved portions of the gas heater 420 installed on the six heat pipes at the opposite, second end. In addition, the flow tube passage for the flow tube 445 may continue through the third portion. The first end of the third portion may be installed onto the second end of the second portion such that the three curved portions installed there are inserted into the corresponding curved removed volumes in the third portion of the first stage 430a. The third portion may be sufficiently thick in order to cover the three curved portions installed at the second end of the second portion such that the three curved portions are not exposed towards the second stage 430b.

Figure 5G:
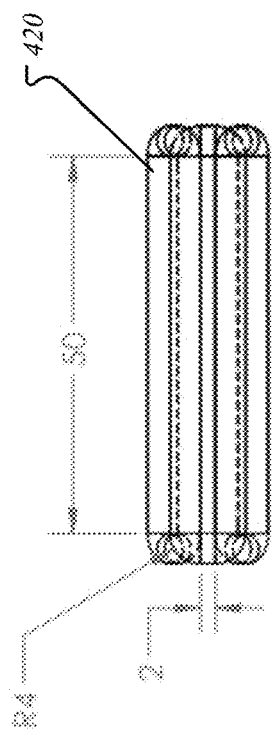
FIG. 5G shows a side view schematic of a gas heater, according to an embodiment of the present disclosure.
Figure 5F:
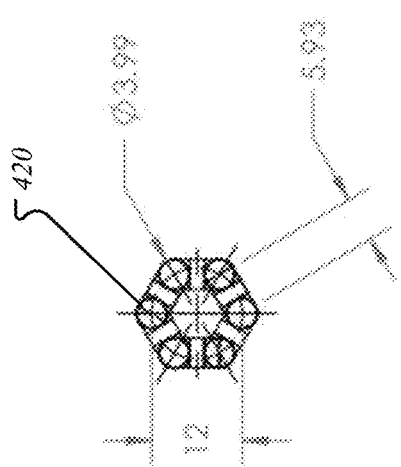
FIG. 5F shows a schematic viewed down a length axis of a gas heater, according to an embodiment of the present disclosure.

FIG. 5F shows a schematic viewed down the length axis of the gas heater 420, according to an embodiment of the present disclosure. FIG. 5G shows a side view schematic of the gas heater 420, according to an embodiment of the present disclosure. In an embodiment, a length and thickness of the straight portions of the gas heater 420 may be designed to sufficiently heat the flow tube 445 and conductively heat the gas throwing through it. For example, the length may be 25 mm to 75 mm, 30 mm to 60 mm, or preferably, 50 mm. For example, the thickness may be 2 mm to 6 mm, or 3 mm to 5 mm, or preferably, 4 mm. A thickness of the curved portions (i.e. how deep the curved portions extend into the first and third portions) may be, for example, 4 mm to 6 mm, or preferably, 5 mm. A diameter of the flow tube passage for the flow tube 445 may be, for example, 4 mm to 8 mm, or 6 mm to 7 mm, or preferably, 6.35 mm.

Thus, a nearest neighbor distance separating centers of two adjacent straight portions in the annular arrangement around the flow tube 445 may be, for example, 4 mm to 8 mm, or 5 mm to 7 mm, or preferably, 5.9 mm.

Figure 6B:
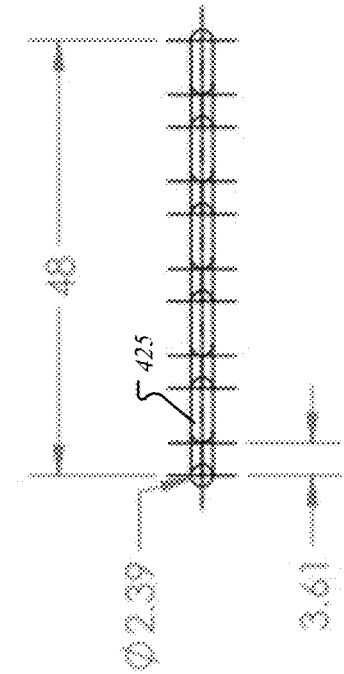
FIG. 6B shows a transparent view schematic of a substrate heater, according to an embodiment of the present disclosure.
Figure 6D:
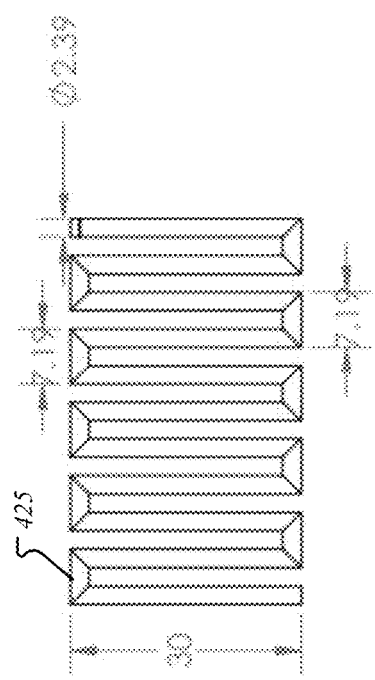
FIG. 6D shows a side view schematic of a substrate heater, according to an embodiment of the present disclosure.
Figure 6A:
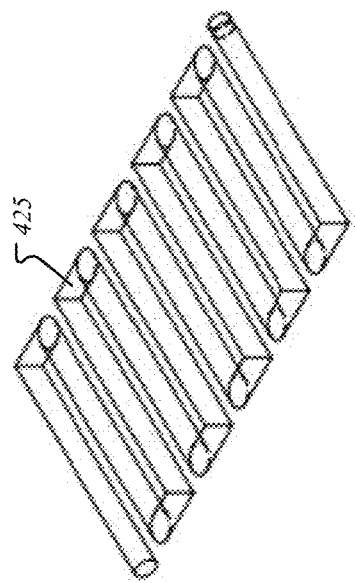
FIG. 6A shows a transparent view schematic of a second stage, according to an embodiment of the present disclosure.

FIG. 6A shows a transparent view schematic of the second stage 430b, according to an embodiment of the present disclosure. FIG. 6B shows a transparent view schematic of the substrate heater 425, according to an embodiment of the present disclosure. In an embodiment, the second stage 430b adopts a semicylinder shape, wherein the cylinder is cut in half along its length axis to yield a curved portion along an exterior of the shape (prior to cutting), and a flat portion (surface) spanning where the cut through the cylinder was made. Note that the act of cutting the cylinder in half is merely used to facilitate visualization and description of certain orientations of surfaces and feature, and does not describe a limiting embodiment of fabrication for the second stage 430b. For example, instead of cutting, the second stage 430b may be molded, CNC machined, etc. The flat portion of the second stage 430b may be configured to receive the substrate heater 425. In an embodiment, the surface of the flat portion may be configured to receive the substrate heater 425 disposed on top of the flat portion. In an embodiment, the surface of the flat portion may include a volume of the insulation 430 removed and recessed into the flat portion. In an embodiment, the surface of the flat portion may include a volume of the insulation 430 removed and recessed into the flat portion to match a predetermined pattern of the substrate heater 425. The recessed volume may be configured to receive the substrate heater 425 inserted therein. For example, the recessed volume may be molded, CNC machined, milled, etc. For example, the substrate heater 425 may have a serpentine structure (as shown), a spiral structure, a parallel array structure, a fan structure, a cross-hatch structure, or any combination thereof. A cross-section of the substrate heater 425 may be, for example, circular (as shown), triangular, rectangular, or any other shape suitable to form the serpentine structure. The substrate heater 425 may be configured to heat to a predetermined temperature. Similar to the gas heater 420, the predetermined temperature may be determined by the growth recipe and controlled via the PID 455. In an embodiment, the substrate bed 435 may be disposed over the substrate heater 425 (and the substrate over the substrate bed 435) in order to more uniformly distribute heat to the substrate. For example, the substrate bed 435 may be made of silicon and sufficiently thick to reduce hotspot formations on the substrate.

Figure 4C:
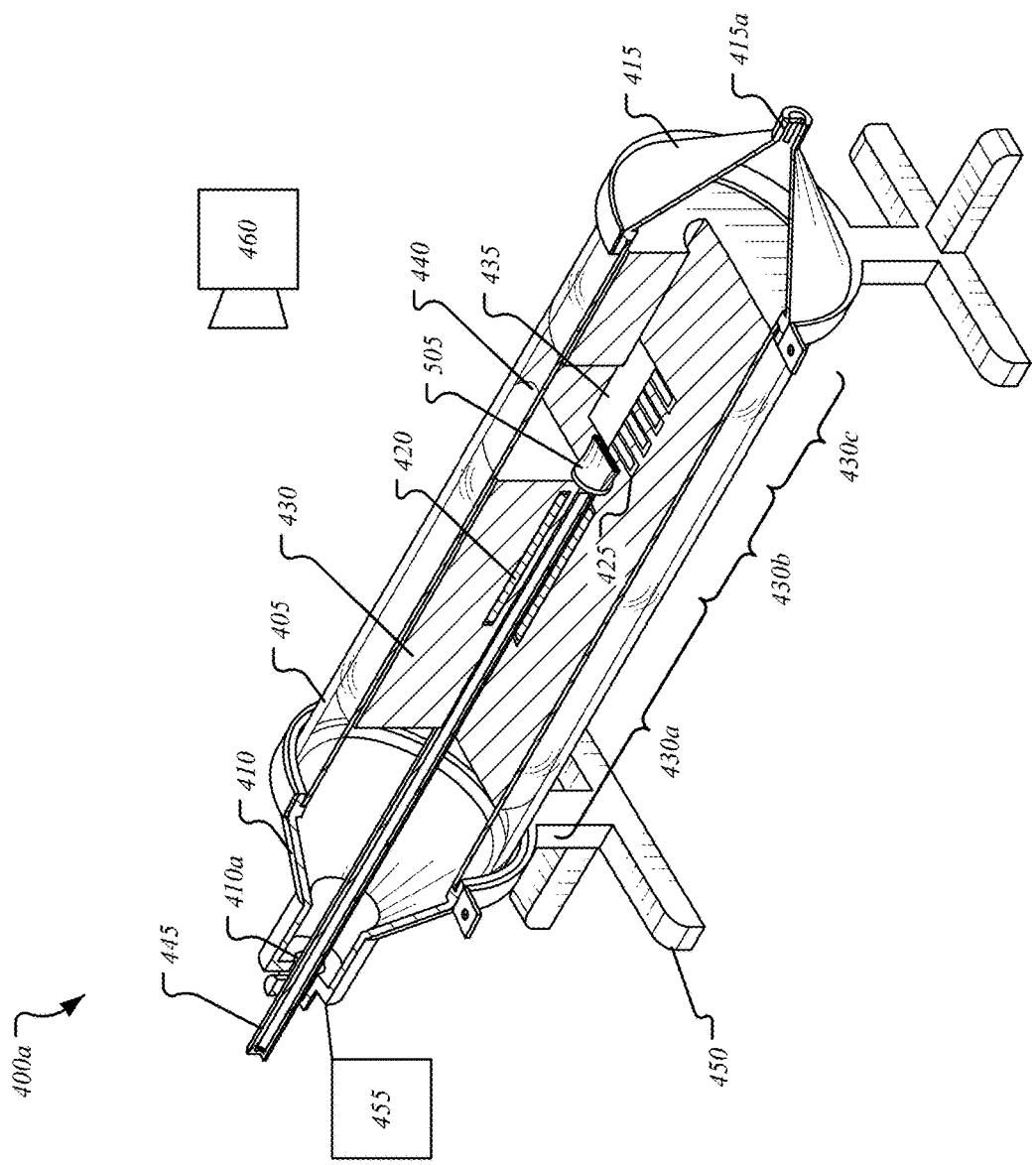
FIG. 4C shows a perspective view schematic of a CNT growth furnace apparatus with a spreading funnel, according to an embodiment of the present disclosure.

The half of the cylinder shape not included in the second stage 430b forms the window 440 to allow visual inspection of a substrate placed on the substrate heater 425. For optimal transparency through the body 405 at the second stage 430b, a transparent material may be used to span this segment of the body 405, for example quartz. When the first stage 430a and the second stage 430b are disposed adjacent in the body 405, the substrate heater 425 may be disposed adjacent to the first end of the flow tube 445, wherein heated gas exiting the flow tube 445 at the first end of the flow tube 445 may immediately come into contact with the substrate disposed on the substrate heater 425 and the substrate bed 435, thereby reducing the amount of cooling the gas undergoes before reaching the substrate. FIG. 4C shows a perspective view schematic of a furnace 400a with a spreading funnel 505, according to an embodiment of the present disclosure. The spreading funning 505 may be bill-shaped, wherein the bill forms a narrow slit comprised of two opposing "lips". The spreading funnel 505 may be configured to fan the gas and precursor from the flow tube 445 over a wider angle across the substrate (as compared to gas exiting the flow tube 445 having a circular cross-section at the first end of the flow tube 445). This may allow for larger substrates to be used for CNT growth and prevent the gas and precursor from the flow tube 445 from forming in a narrow cone over the substrate.

Figure 6C:
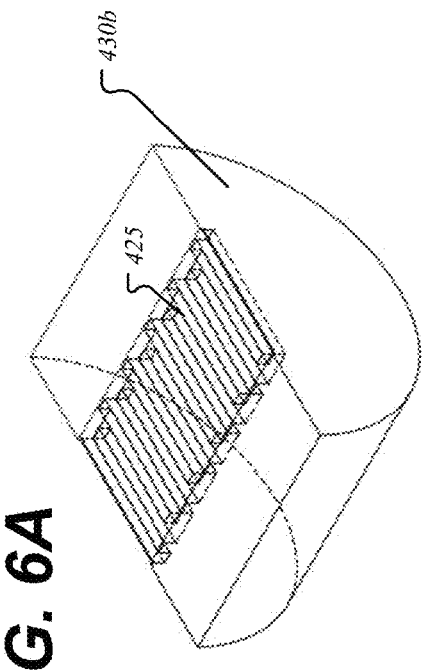
FIG. 6C shows a top-down view schematic of a substrate heater, according to an embodiment of the present disclosure.

FIG. 6C shows a top-down view schematic of the substrate heater 425, according to an embodiment of the present disclosure. FIG. 6D shows a side view schematic of the substrate heater 425, according to an embodiment of the present disclosure. In an embodiment, as shown in FIG. 6B and FIG. 6C, the serpentine structure of the substrate heater 425 includes a straight portion and a connector portion. A length of the straight portion may be, for example, 20 mm to 40 mm, or 25 mm to 35 mm, or preferably, 30 mm. A length of the connector portion may be, for example, 5 mm to 10 mm, or 6 mm to 8 mm, or preferably, 7.2 mm. A thickness of the substrate heater 425 may be, for example, 1 mm to 5 mm, or 2 mm to 4 mm, or preferably, 2.4 mm. The substrate heater 425 may cover a maximum area of, for example, 25 mm by 40 mm, or 40 mm by 60 mm, or preferably, 30 mm by 50 mm.

FIG. 7A shows a transparent view schematic of the third stage 430c, according to an embodiment of the present disclosure. FIG. 7B shows a schematic viewed down a length axis of the third stage 430c, according to an embodiment of the present disclosure. In an embodiment, the third stage 430c is substantially cylindrical to conform to the shape of the body 405. A hollow channel is removed along the length axis of the third stage 430c in order to provide an exhaust pathway to the outlet cap 115a for the gas to travel through after passing through the second stage 430b. The cross-sectional shape of the hollow channel removed may be designed to allow sufficient flux of the gas through and prevent a pressure build-up in the second stage 430b.

In an embodiment, the CNT growth recipe may call for the gas heater 420 and the substrate heater 425 to reach a predetermined temperature in order to sufficiently heat the gas (or gas and precursor mixture) and the substrate, respectively. The gas heater 420 and the substrate heater 425 may need a predetermined amount of input power to reach the predetermined temperature. For example, the predetermined temperature for the gas and precursor mixture may be 850° C. As described in (Incropera F., Dewitt D., Bergman T., Lavine A. (2013). Principles of Heat and Mass Transfer. 7th Edition.—incorporated herein by reference in its entirety), the input power may be determined by $$q = Q\rho C_p \Delta T$$

where q is the heat power required, Q=8500 mm$^3$ s$^{-1}$ is the flow rate, $\rho$ is the precursor density, $C_p$ is the precursor heat capacity, and $\Delta T$=825° C. is the precursor temperature difference. Table 1 provides information regarding precursor gas properties, according to an embodiment of the present disclosure Based on the averaged values in Table 1, the value for q in this example may equal 24.4 W.

TABLE 1

| Precursor gas properties | | | | |
|---|---|---|---|---|
| Property\Gas | $H_2$ | He | $C_2H_4$ | Average* |
| $C_p$ (J/kg · K) | 14500 | 5193 | 1530 | 9126 |
| $\rho$ (kg/m$^3$) | 0.08078 | 0.1625 | 1.26 | 0.3807 |
| q (sccm) | 250 | 140 | 120 | |
| K (W/m · C) | 0.2 | 0.17 | 0.035 | 0.15 |
| $\mu$ (Pa · s) | 1.53E−05 | 3.48E−05 | 1.79E−05 | 2.12647E−05 |

FIG. 8A shows a simulation of temperature distribution along a length of the flow tube 445, according to an embodiment of the present disclosure. FIG. 8B shows a simulation of temperature distribution along a wall thickness of the flow tube 445, according to an embodiment of the present disclosure. Table 2 summarizes the assumptions made for the following simulations, according to an embodiment of the present disclosure. Table 3 summarizes the described lengths of various components in the furnace 400 that allow for effective insulation of the generated heat, according to an embodiment of the present disclosure. In an embodiment, the length of the flow tube 445 may be calculated based on simulations, for example via Finite Element Analysis (FEM). The heating process may be approximated considering an outer surface of the flow tube 445 in a heating zone (i.e. near the gas heater 420) is subjected to a temperature of 1000° C. and an inner surface of the flow tube 445 is subjected to a convection heat transfer via the formula $$Nu = \frac{hD}{K}$$

where Nu is the Nusselt number, h is the film coefficient, D is the pipe characteristic length, and K is the thermal conductivity of the precursor. For a laminar flow in a pipe with constant wall temperature, Nu=3.66. The characteristic length of the flow tube 445 and thermal conductivity of the gas mixture, respectively, are D=4.4×10$^{-3}$ m and K=0.15 W/m·C. Hence, the film coefficient is found to be 127.3 W/m$^2$·C and constant along the flow tube 445. FIG. 8A demonstrates that, at steady state, the flow tube 445 cools down from 850° C. to approximately 60° C. over a span of 5.5 cm away from the heating zone along the length of the flow tube 445. FIG. 8B demonstrates that the temperature only decreases by approximately 3° C. along the thickness from the exterior to the interior of the flow tube 445, which indicates that it is not required to elevate the temperature of the gas heater 420 above the predetermined temperature of 850° C.

TABLE 2

| Simulation parameters | |
|---|---|
| Condition | Assumption |
| Outer Temperature | Room Temperature of 21° C. |
| Outer Pressure | Room Pressure of 101 kPa |
| Heat Coefficient | h = 5.0-20.0 W/(Km$^2$) |
| Gas composition | Identical to setup parameters (e.g.: 50% Hydrogen & 50% Ethylene) |
| Gravitational Acceleration | 9.81 m/s$^2$ |
| Radiation coefficient | Using real surface Solidworks settings for each material |
| Roughness | Smooth surfaces |
| Atmosphere | Air (Approx. 80% Nitrogen & 20% Oxygen) |
| Coil shape | Solid cylindrical body |
| Substrate coil temperature | Constant temperature of 800° C. |
| Gas furnace coil temperature | Constant temperature of 1000° C. |
| Flow rate | Identical to setup parameters (e.g.: 60 ml/min Hydrogen & 60 ml/min Ethylene) |
| Outlet conditions | Environmental conditions (outer temp. and pressure) |
| Porosity | Porous parts are given porosity corresponding to their materials. |

TABLE 2-continued

| Simulation parameters | |
|---|---|
| Condition | Assumption |
| Contact Resistance | No contact resistance is taken (Ideal contact) |
| Fastening | All parts are simulated to be glued together |
| Power consumption | Generally, no power consumption is predefined. |

TABLE 3

| Quartz tube length approximation | |
|---|---|
| Section | Length (cm) |
| Heater | 8.6 |
| Funnel | 2.5 |
| Substrate Stage | 5 |
| Cap Overlap | 3 |
| Total | 20 |

Figure 9A:
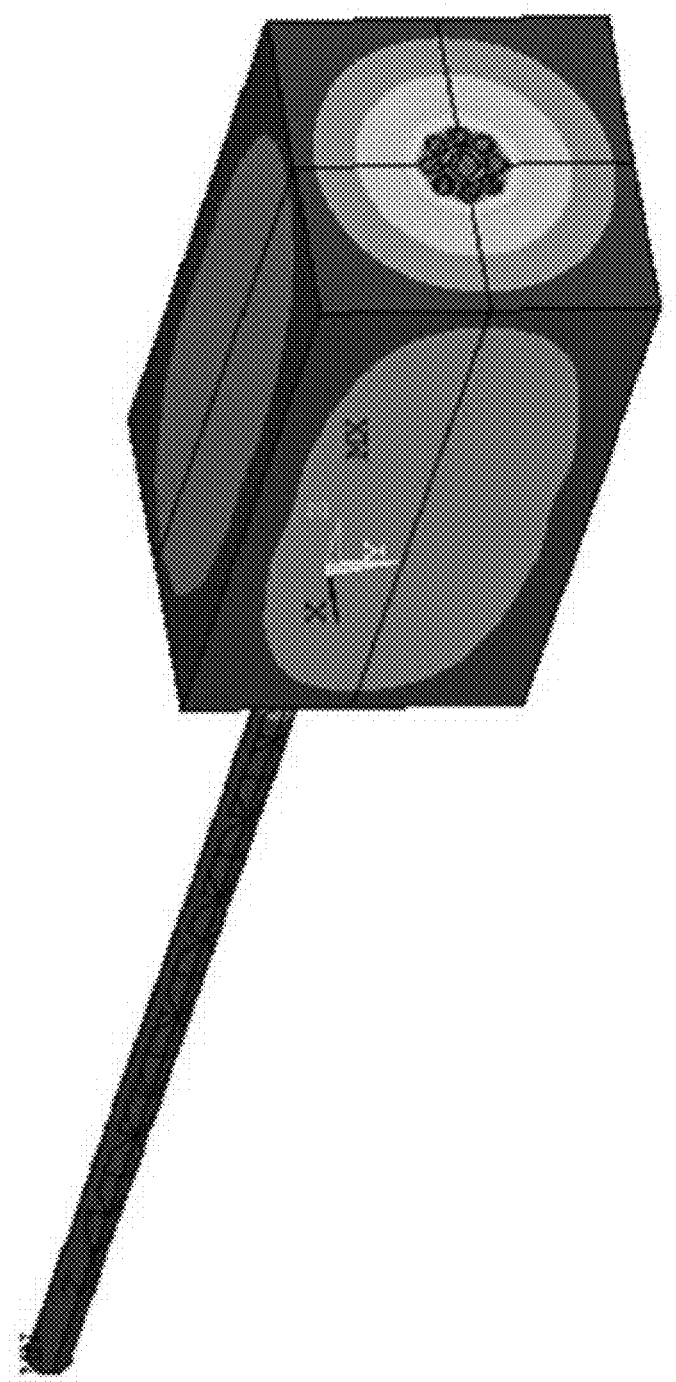
FIG. 9A shows a perspective view of a simulation of temperature distribution within insulation during a growth run, according to an embodiment of the present disclosure.
Figure 9B:
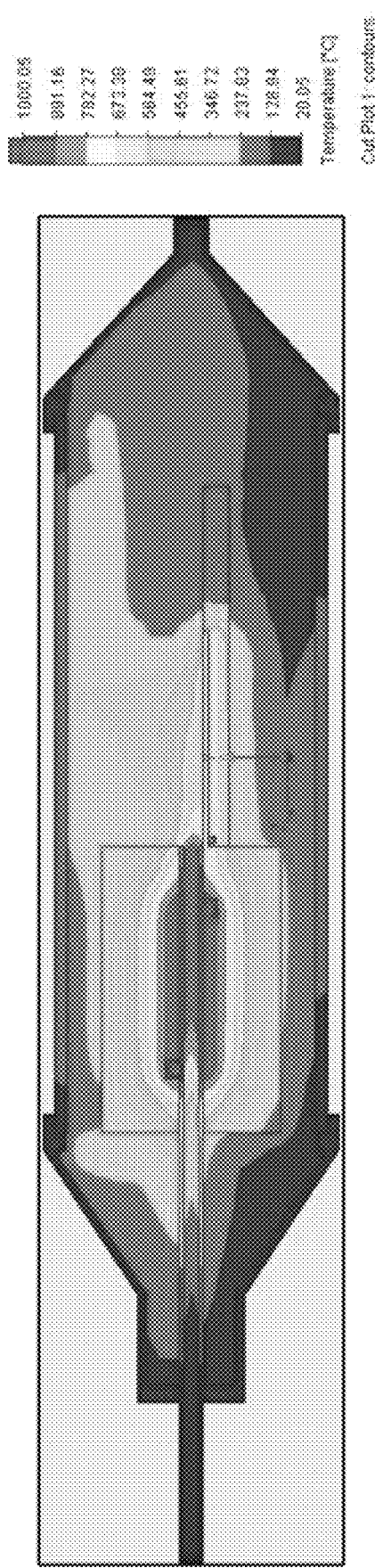
FIG. 9B shows a side view of a simulation of temperature distribution within a furnace during a growth run, according to an embodiment of the present disclosure.

FIG. 9A shows a perspective view of a simulation of temperature distribution within the insulation 430 during a growth run, according to an embodiment of the present disclosure. Preliminary simulations, for example by ANSYS or Solidworks flow simulation, may be used to obtain basic information about the heat distribution along the insulation 430. Again, Table 2 includes the major assumptions made in the making of the simulations. In an embodiment, the furnace 400 includes a rudimentary design with a substantially square cross-section for the shape of the insulation 430 with a flat substrate heater 425 attached. The steady state simulation showed a reasonable gas temperature distribution; however, the steady state simulation also predicted the temperature was not uniform along the substrate heater 425, and the insulation 430 allowed components along the exterior of the furnace 400 to reach high temperatures. FIG. 9B shows a side view of a simulation of temperature distribution within the furnace 400 during a growth run, according to an embodiment of the present disclosure. As shown in FIG. 9B, the temperatures at the inlet and outlet caps 410, 415 reached approximately 200° C., which were determined to be too high.

Figure 9C:
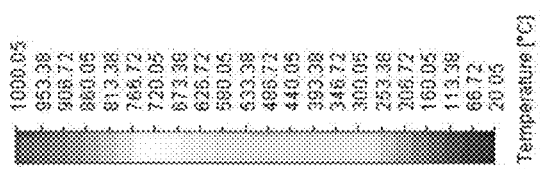
FIG. 9C shows a side view of a simulation of temperature distribution within a cylindrical insulation during a growth run, according to an embodiment of the present disclosure.
Figure 9C:
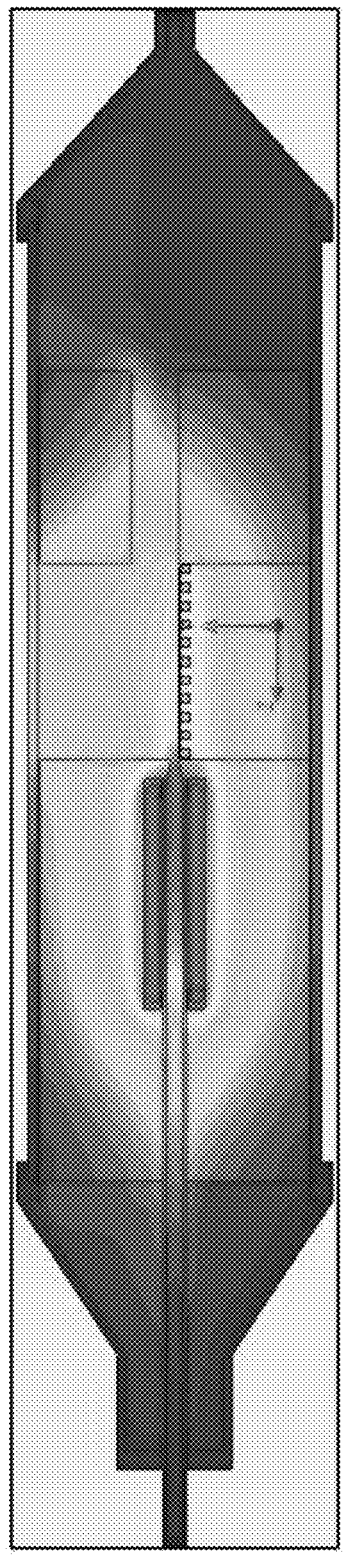
Figure 9D:
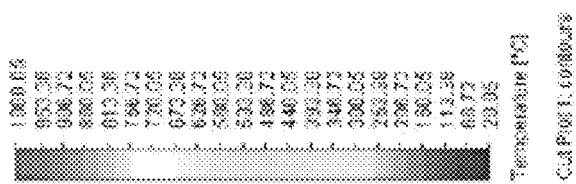
FIG. 9D shows a side view of a simulation of temperature distribution within porous insulation during a growth run, according to an embodiment of the present disclosure.
Figure 9D:
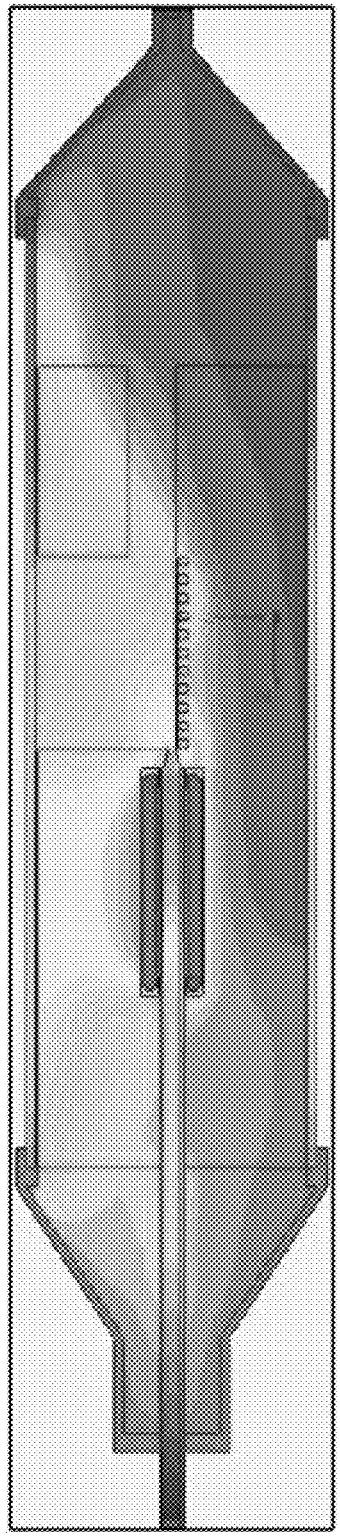

FIG. 9C shows a side view of a simulation of temperature distribution within the cylindrical insulation 430 during a growth run, according to an embodiment of the present disclosure. In an embodiment, when the three stages 430a-c are assembled, they may sufficiently insulate a user from the heat generated by the gas heater 420 and the substrate heater 425. For example, a combined length of the three stages 430a-c may be, for example, 190 mm to 250 mm, or 200 mm to 220 mm, or preferably, 210 mm. Thus, the length of the flow tube 445 spanning the three stages 430a-c may be sufficiently long to have a second end of the flow tube 445 at or extending beyond the input port 110a be sufficiently cooled. That is, the length of the flow tube 445 from the first end of the flow tube 445 (at the junction of the first stage 430a and the second stage 430b) to the second end of the flow tube 445 at the input port 110a may be 210 mm, or preferably, greater than 210 mm. The flow tube 445 may be made of a heat conducting metal, for example, aluminum. Moreover, the design and volume of insulation 430 used may prevent temperatures in various parts of the furnace 400 from exceeding a predetermined threshold. Notably, the cross-section of the insulation 430 is circular and fills the interior of the body 405 to maximize its heat insulating effect. For example, the insulation 430 may prevent the temperature of the inlet cap 410 at its attachment point to the body 405 from exceeding a melting temperature of the inlet cap 410 material. In a case where the melting temperature of the inlet cap 410 material is exceeded, for example in the simulation shown in FIGS. 9A and 9B, the inlet cap 410 may deform and the fluid seal formed between the inlet cap 410 and the first end of the body 405 may break, resulting in other gasses or liquids entering the furnace 400. Advantageously, as shown in FIG. 9C, based on the described dimensions of the furnace 400 components, the compact design of furnace 400 not only allows for even heat distribution across the gas heater 420 and substrate heater 425, but also localizes the heating by insulating the heaters 420, 425 from the temperature-sensitive structural components. This is enabled by integrating the gas heater 420 directly into the insulation 430 of the first stage 430a. Furthermore, the substrate bed 435 is shown to reduce hotspot formation from the individual heating elements in the substrate heater 425. In order to increase the reliability of the model, the insulating material may be modeled as a porous medium rather than assuming it to be a solid in order to determine the maximum temperature creep through the insulation 430. FIG. 9D shows a side view of a simulation of temperature distribution within porous insulation 430 during a growth run, according to an embodiment of the present disclosure. As shown in FIG. 9D, the porous medium results in a less insulated nature for the furnace 400, and inlet and outlet cap 410, 415 materials may be selected based on the type of insulation 430 used.

Figure 9E:
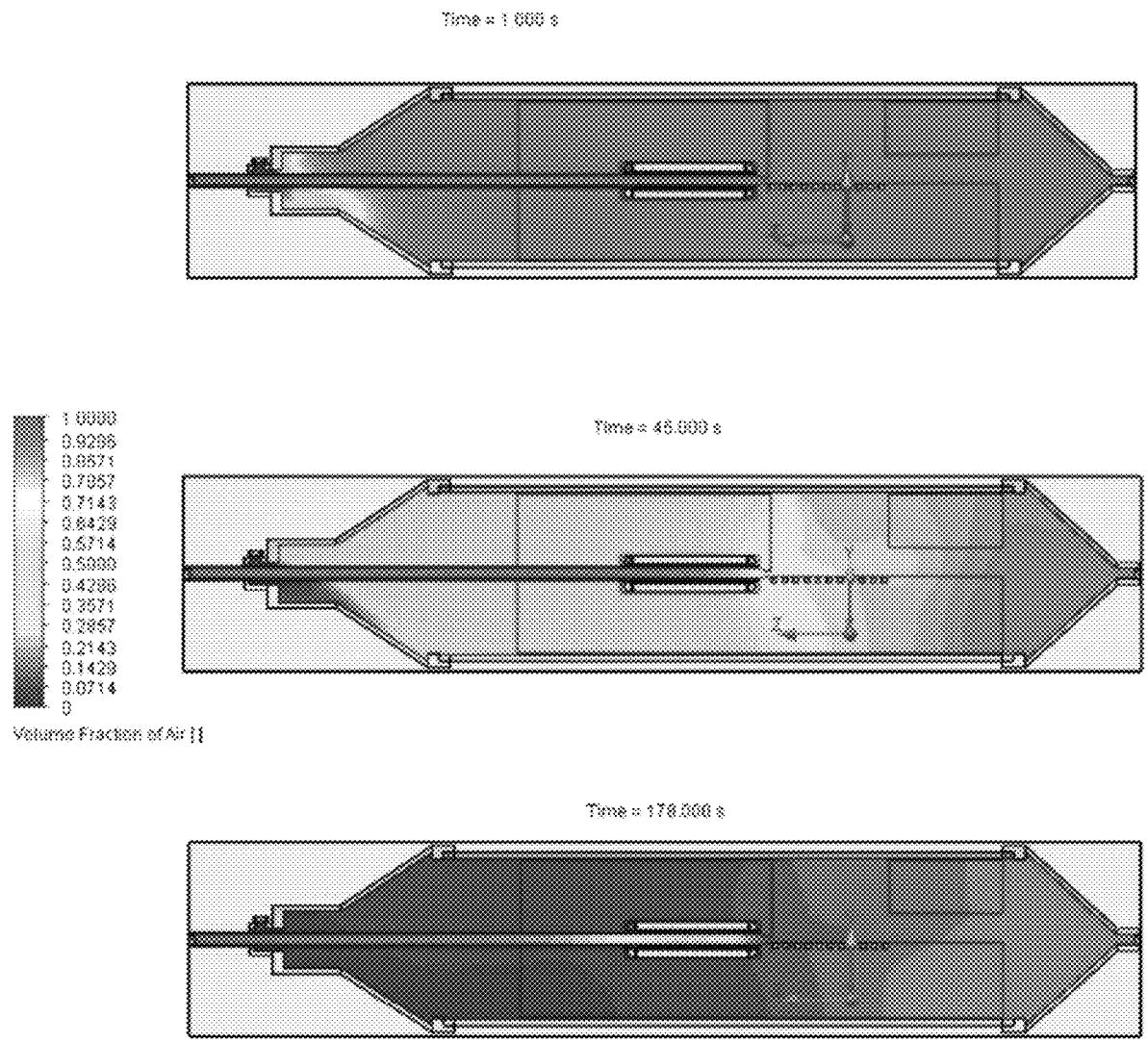
FIG. 9E shows a side view simulation of gas purging in a furnace, according to an embodiment of the present disclosure.

FIG. 9E shows a side view simulation of gas purging in the furnace 400, according to an embodiment of the present disclosure. FIG. 9E shows a time-dependent simulation performed on the setup to determine the time required to flush the setup with inert gas, and to compare different inert gases for this purpose.

Figure 9F:
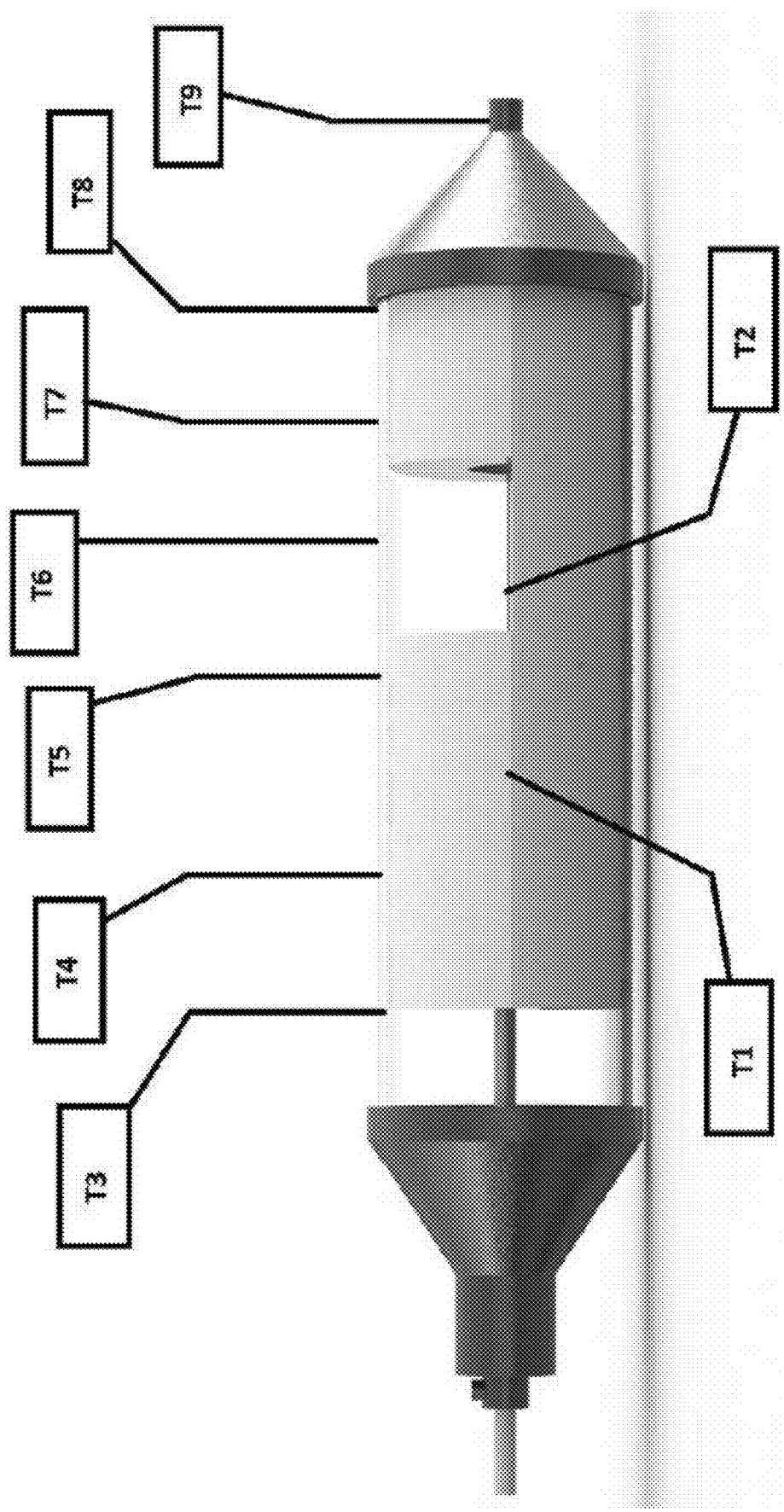
FIG. 9F shows experimental temperature measuring locations within a furnace, according to an embodiment of the present disclosure.

Table 4 provides temperature measurements recorded from experimental trials at various locations in the furnace 400 in comparison to the simulated expected temperatures, according to an embodiment of the present disclosure. FIG. 9F shows the experimental temperature measuring locations within the furnace 400, according to an embodiment of the present disclosure. As shown, the boxed values indicate experimental results at certain locations in the furnace 400 having the insulation 430 with the circular cross-section from FIG. 9C. These correlate with the values provided in Table 4. Notably, the values are not only very close, but also identical in some cases, demonstrating that the simulations were very reliable and confirming the design parameters selected for the furnace 400 were sufficient for heat insulation. Furthermore, due to the effective insulation of heat in the first stage 430a, the window 440 may be included without allowing excess heat from escaping through the window 440. Advantageously, this allows the user to visually monitor the CNT growth or install imaging system 460 capable of monitoring and recording the CNT growth and signaling that an optimal end point for the CNT growth has been reached. For example, an optical/digital camera with 100 to 1000× magnification can be used, such as a Zeiss Axio system. The growth can be measured from the captured images or real-time video of the camera. The imaging system 460 may include processing circuitry to determine a visual threshold has been reached in order to signal for the reaction to end. For example, the imaging system 460 may determine a density threshold of the CNT forest has been reached. For example, the imaging system 460 may determine a length threshold of one or more CNTs has been reached.

TABLE 4

Experimental and simulation results

| Position | Experimental | Simulation | % Difference |
| --- | --- | --- | --- |
| T1 | 1005 | 1001 | 0.4 |
| T2 | 820 | 813 | 0.9 |
| T3 | 81 | 78 | 3.7 |
| T4 | 173 | 160 | 7.5 |
| T5 | 247 | 253 | 2.4 |
| T6 | 345 | 347 | 0.6 |
| T7 | 191 | 206 | 7.9 |
| T8 | 120 | 113 | 5.8 |
| T9 | 66 | 67 | 1.5 |

Figure 10A:
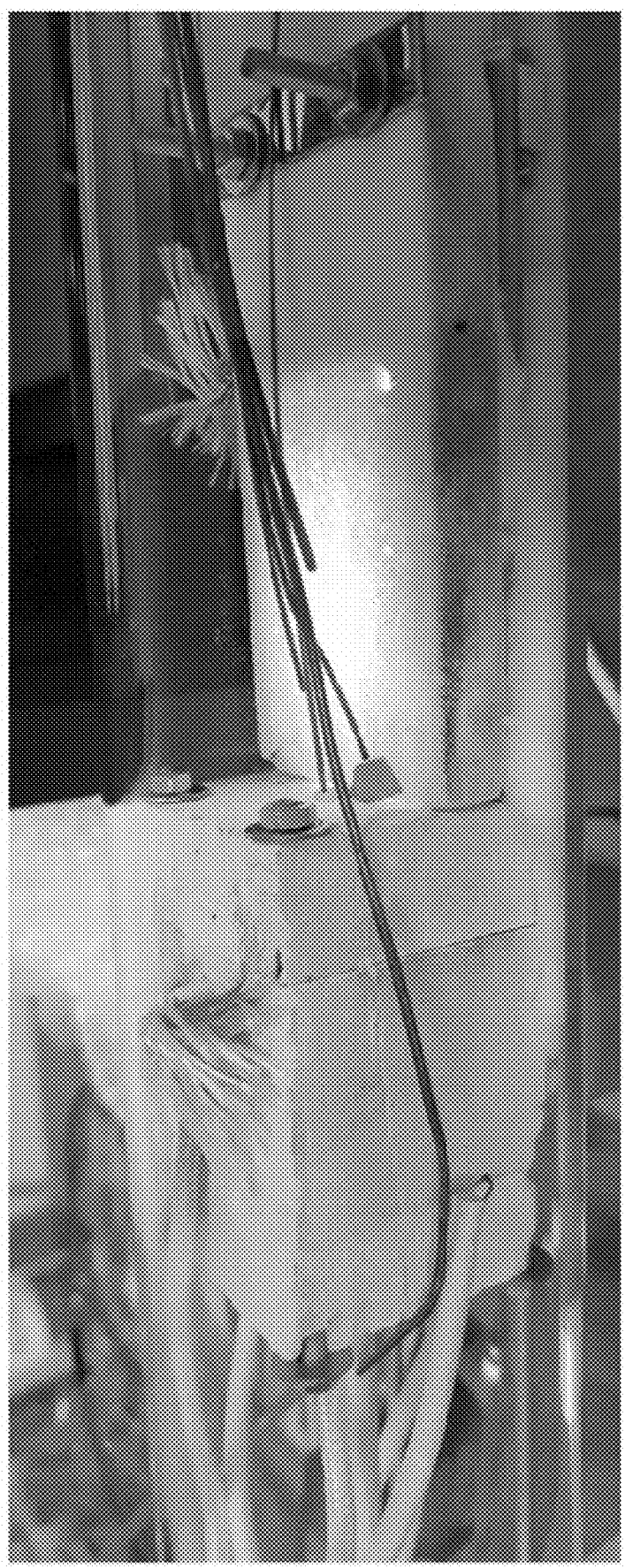
FIG. 10A shows an optical image of a furnace with a rectangular insulation during a growth cycle, according to an embodiment of the present disclosure.
Figure 10B:
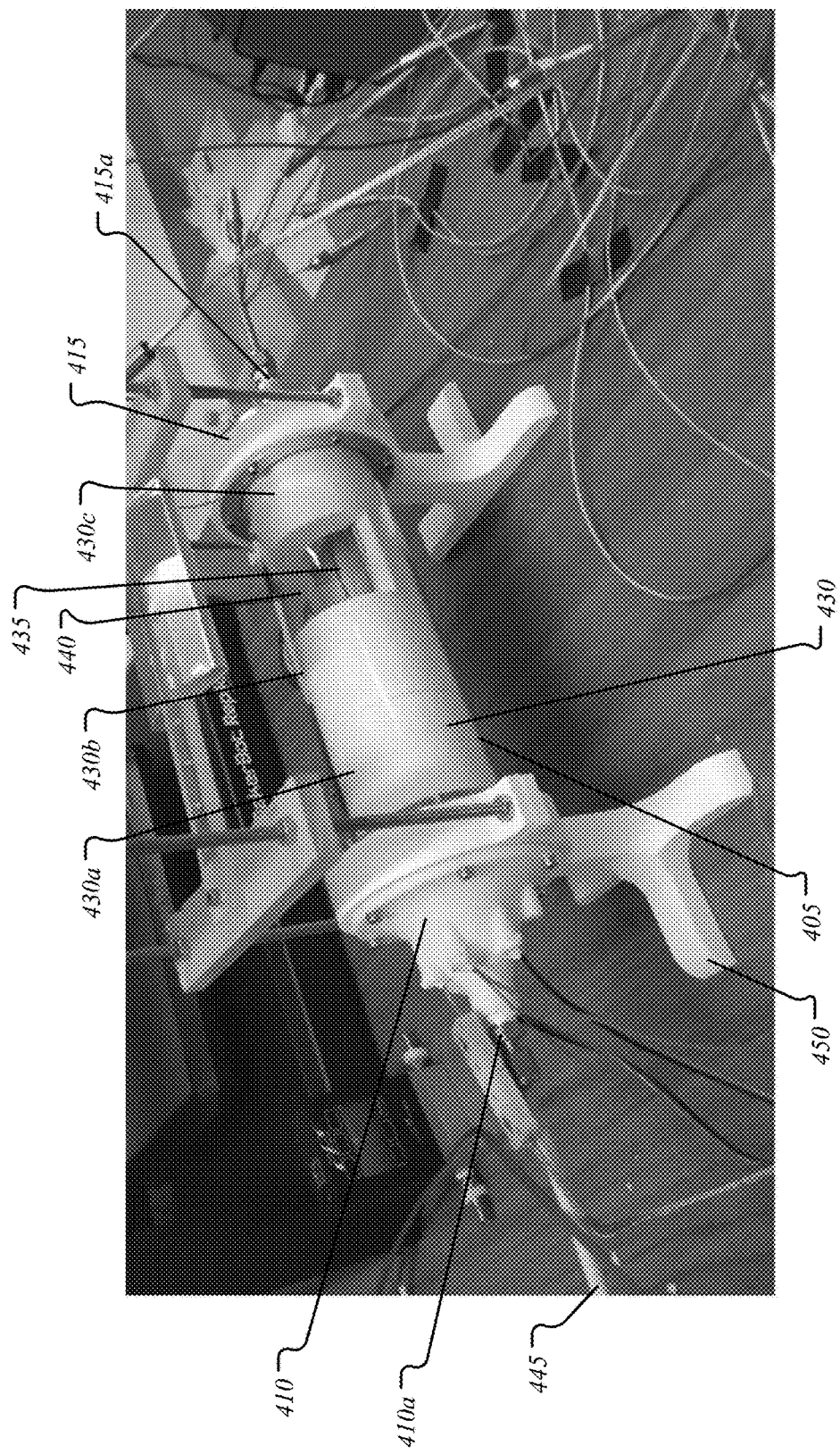
FIG. 10B shows an optical image of a furnace with a cylindrical insulation during a growth cycle, according to an embodiment of the present disclosure.
Figure 10C:
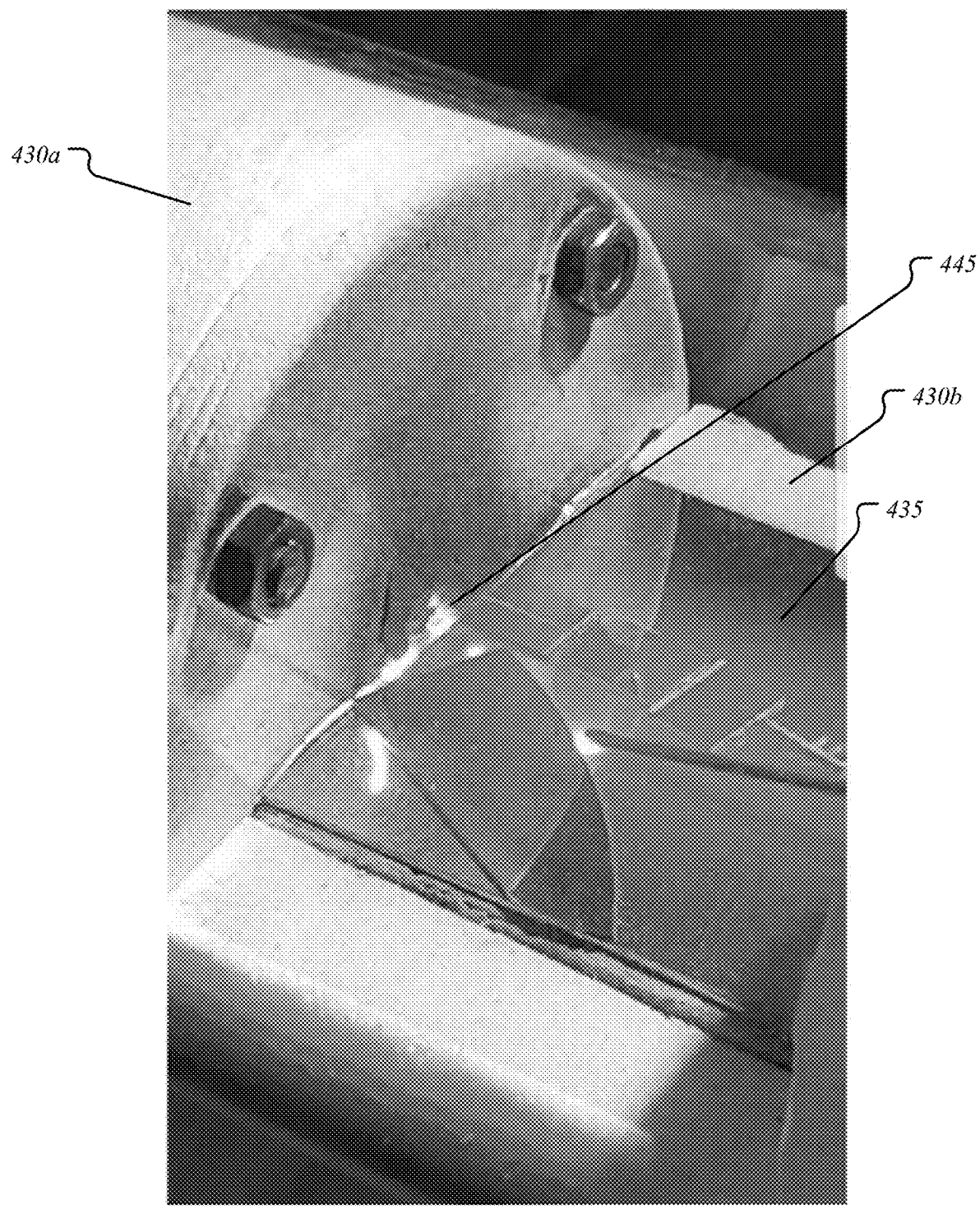
FIG. 10C shows an optical image of a view through a window in a second stage, according to an embodiment of the present disclosure.

FIG. 10A shows an optical image of the furnace 400 with a rectangular insulation during a growth cycle, according to an embodiment of the present disclosure. The furnace 400 here includes insulation 430 having a square cross-section that does not fill the volume of the interior of the body 405. FIG. 10B shows an optical image of the furnace 400 with a cylindrical insulation during a growth cycle, according to an embodiment of the present disclosure. Note that the inlet cap 410 includes a plurality of the inlet ports 410a in order to allow circuitry from the PID 455 to connect to the gas heater 420 and the substrate heater 425. Also note how the window 440 provides a space through which the growth of CNTs on the substrate may be viewed. Also note the overall, compact size of the furnace 400 allows it to be placed on a desktop or benchtop while running the growth cycle. FIG. 10C shows an optical image of a view through the window 440 in the second stage 430b, according to an embodiment of the present disclosure. Here, multiple substrates are disposed on the substrate bed 435, and a view of the first end of the flow tube 445 is visible. The growth cycle is running, which leads to the red glow of the substrate bed 435 via the substrate heater 425. Notably, no heating hot spots are visible on the substrate bed 435, so the substrate bed 435 is serving to distribute the heat from the substrate heater 425 evenly to the substrates disposed on the substrate bed 435. Also visible is the attachment mechanism to secure the first, second, and third portions of the first stage 430a together. Two visible screws have been drilled through and secured by two nuts as seen on the exposed end of the third portion. To reiterate, it may be appreciated that other means of securing the first, second, and third portions of the first stage 430a together may be used.

Table 5 and 6 provide a comparison between the presently disclosed furnace 400 and commercial offerings, such as the SabreTube, according to an embodiment of the present disclosure. Advantageously, based on the overall footprint of the SabreTube, the furnace 400's footprint is smaller at 50 cm by 20 cm as compared to SabreTube's 60 cm by 30 cm footprint. This is enabled by the furnace and substrate heater 420, 425 which are incorporated into the insulation 430, whereas the SabreTube's gas heater is located externally and as a separate component, thereby decreasing its heating efficiency and increasing its footprint. Additionally, the furnace 400 is capable of holding a substrate with an area that is 30 mm by 50 mm as compared to SabreTube's 10 mm by 100 mm. Thus, the overall area of the substrate capable of fitting in the furnace 400 is 50% larger. The PID controller 455 is capable of controller up to three channels, while most commercial controllers are only capable of controlling one channel. Furthermore, the size of the PID controller 455 is also smaller at 154 mm by 112 mm by 84 mm, while most commercial controllers may be 250 mm by 204 mm by 90 mm. Finally, the cost to construct the furnace 400 is incredibly low as compared to a commercial offering. The furnace 400 cost just 15,890 SAR (under $4,300 USD) to construct, while the market cost of the SabreTube is 450,720 SAR (over $120,000 USD). Thus, the furnace 400 presents an option with greater size and heating efficiency with larger substrate accommodation for consumers, such as start-up labs or young research groups, seeking a financially feasible CNT growth apparatus.

TABLE 5

Comparison to other system

|  | Disclosed Furnace | SabreTube |
|---|---|---|
| Overall Size | 50 cm × 20 cm | 60 cm × 30 cm |
| Max. Substrate Size | 30 × 50 mm | 10 × 100 mm |
| Operating Temperatures | Up to 1000 C. | Up to 1000 C. |
| Gas heater location | Inside | Outside |
| Cost | Build cost: 15890 SAR | Market price: 450720 SAR |

TABLE 6

Comparison to other controller

|  | Disclosed PID | Other controller |
|---|---|---|
| Number of control channels | 3 | 1 |
| Overall Size | 154 × 112 × 84 mm | 250 × 204 × 90 mm |
| Price | 600 SAR | ≥1500 SAR |

Figure 11:
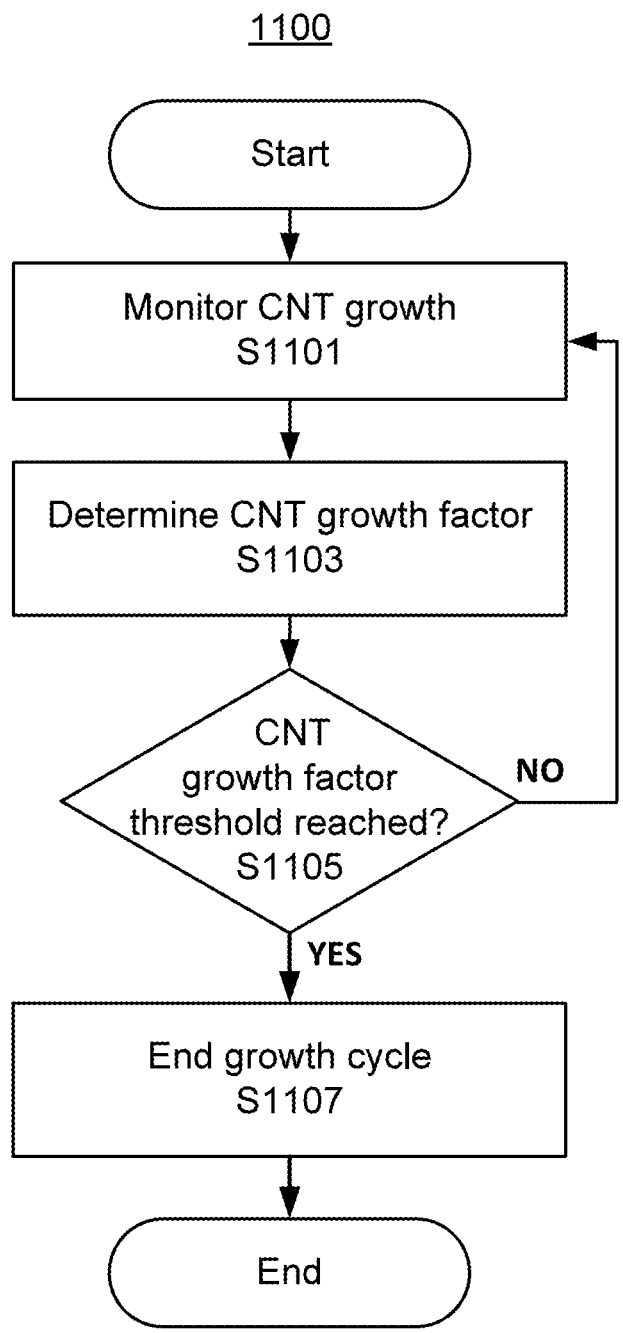
FIG. 11 shows a block diagram of a method of monitoring CNT growth, according to an embodiment of the present disclosure.

FIG. 11 shows a block diagram of a method 1100 of monitoring CNT growth, according to an embodiment of the present disclosure. In step S1101, the imaging system 460 may visually monitor the CNT growth through the window 440. For example, the imaging system 460 may record images or video continuously. In step S1103, the imaging system 460 may determine a growth factor of the CNTs during the growth cycle. For example, the imaging system 460 may determine a density of the CNTs. For example, the imaging system 460 may determine an average length of the CNTs. In step S1105, the imaging system 460 may determine if a growth factor threshold has been reached. For example, the imaging system 460 may determine if a density threshold of the CNTs has been reached. For example, the imaging system 460 may determine if an average length threshold of the CNTs has been reached. In response to determining a threshold has not be reached, the imaging system 460 may go to step S1101 and continue monitor the CNT growth. In response to determining a threshold has been reached, the imaging system 460 may proceed to step S1107 and end the CNT growth cycle.

An implementation of an exemplary embodiment of the apparatus is as follows. First, the substrate is loaded onto the substrate bed 435 and the interior of the furnace 400 is sealed by securing the inlet cap 410 and the outlet cap 415 to the body 405. Second, an inert gas (i.e. argon) is pumped from a gas source through the furnace 400, and subsequently exhausted through the outlet cap 415 to purge the furnace 400 of oxygen. The gas heater 420 and the substrate heater 425 may be brought up to the predetermined temperature during this time. Third, the precursor is mixed in with gas and flowed through the flow tube 445 where it is heated by the gas heater 420. The gas and precursor mixture exits the flow tube 445 at the first end and flows over the substrate disposed on the substrate bed 435 where the substrate heater 420 has heated the substrate (either directly or via the substrate bed 435) to the predetermined temperature. The CNT growth reaction subsequently occurs on the surface of the substrate and is monitored visually by the operator or via the imaging system 460 until a predetermined time is reached or the imaging system 460 determines a visual threshold has been reached and signals for the reaction to end. Finally, the gas and precursor mixture supply is cut off and the furnace 400 is allowed to cool before retrieving the substrate.

The foregoing discussion describes merely exemplary embodiments of the present disclosure. As will be understood by those skilled in the art, the present disclosure may be embodied in other specific forms without departing from the spirit or essential characteristics thereof. Accordingly, the disclosure is intended to be illustrative, but not limiting of the scope of the disclosure, as well as the claims. The disclosure, including any readily discernible variants of the teachings herein, defines in part, the scope of the foregoing claim terminology such that no inventive subject matter is dedicated to the public.

The invention claimed is:

1. A carbon nanotube (CNT) growth apparatus, comprising:
   a body;
   an inlet cap removeably attached to a first end of the body;
   an outlet cap removeably attached to a second end of the body;
   insulation extending through a portion of an interior of the body, the insulation including a first stage adjacent to the inlet cap, a second stage between the first stage and a third stage, and the third stage adjacent to the outlet cap:
   wherein the first stage is substantially cylindrical and includes a cylindrical flow tube passage housing a flow tube and a plurality of cylindrical heat pipe passages oriented parallel to an axis of the flow tube;
   a gas heater including a plurality of heat pipes configured to be inserted in the plurality of heat pipe passages in the first stage of the insulation to heat the flow tube, the plurality of heat pipes being disposed adjacent to the flow tube passage, oriented circumferentially surrounding the flow tube passage, and aligned parallel to the axis of the flow tube;
   a substrate heater incorporated in the second stage of the insulation;
   a substrate bed disposed on top of and thermally coupled to the substrate heater; and
   a temperature controller configured to adjust a temperature of the gas heater and substrate heater,
   wherein
   the flow tube extends through the inlet cap and passes coaxially through the flow tube passage of the first stage of the insulation and ends at the second stage,
   the flow tube configured to receive and flow a fluid to the interior of the body at the second stage;
   the substrate bed is configured to absorb heat generated by the substrate heater via a first face of the substrate bed and evenly distribute the heat to the substrate via a second face of the substrate bed,
   the substrate heater is located adjacent to the end of the flow tube such that the heated fluid exiting the flow tube immediately contacts the heated substrate,
   a shape of the second stage is semicylinder such that a portion of the second stage is removed along a length axis of the second stage to form a flat surface of the second stage;
   the substrate heater is configured to be inserted into a recess formed in the flat surface of the second stage;

the removed portion of the second stage is configured to provide an unobstructed view of the substrate;

a portion of the body surrounding the second stage is partially transparent and configured to allow visual monitoring of the substrate, and the third stage includes a hollow channel along a length axis of the third stage, the hollow channel configured to allow the fluid to flow from the flow tube to the outlet cap, the hollow channel having a semi-cylinder shape.

2. The apparatus of claim 1, further comprising an optical/digital camera configured to record images or video of the substrate through the portion of removed insulation in the second stage configured to allow visual monitoring of the substrate.

3. The apparatus of claim 2, further comprising electronic hardware configured to determine, in the recorded images or recorded video during a growth cycle, a density of the CNTs grown on the substrate; and end the CNT growth cycle in response to determining the density of the CNTs grown on the substrate has exceeded a predetermined value.

4. The apparatus of claim 1, wherein a volume of the insulation is removed from the surface of the second stage of the insulation in a serpentine pattern to form the recess;

the substrate heater includes an elongated metal structure formed into the serpentine pattern; and the serpentine metal structure is inserted into the serpentine recess in the flat surface of the second stage.

5. The apparatus of claim 1, further comprising a spreading funnel attached to the first end of the flow tube and configured to widen the fan angle of the fluid exiting the first end of the flow tube.

6. The apparatus of claim 1, wherein a material of the body is quartz.

7. The apparatus of claim 1, wherein the body is substantially cylindrical and the insulation is formed to match a diameter of the substantially cylindrical body.

8. The apparatus of claim 1, wherein the inlet cap includes at least one inlet port configured to receive the flow tube and form a fluid seal with the flow tube.

9. The apparatus of claim 8, wherein the outlet cap includes at least one outlet port configured to receive an exhaust tube and form a fluid seal with the exhaust tube.

10. The apparatus of claim 8, wherein the temperature controller is electrically connected to the gas heater and the substrate heater via a plurality of wires inserted through the at least one inlet port.

11. The apparatus of claim 1, a length from a tip of the inlet cap to a tip of the outlet cap is less than 300 mm.

12. The apparatus of claim 1, wherein a material of the insulation is silica.

* * * * *